(12) United States Patent
Matsushita

(10) Patent No.: US 10,468,512 B2
(45) Date of Patent: Nov. 5, 2019

(54) SEMICONDUCTOR DEVICE WITH INSULATED GATE BIPOLAR TRANSISTOR (IGBT) HAVING MULTIPLE RESISTORS

(71) Applicants: KABUSHIKI KAISHA TOSHIBA, Minato-ku, Tokyo (JP); TOSHIBA ELECTRONIC DEVICES & STORAGE CORPORATION, Minato-ku, Tokyo (JP)

(72) Inventor: Kenichi Matsushita, Nonoichi Ishikawa (JP)

(73) Assignees: KABUSHIKI KAISHA TOSHIBA, Tokyo (JP); TOSHIBA ELECTRONICS DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 15/926,361

(22) Filed: Mar. 20, 2018

(65) Prior Publication Data
US 2019/0088769 A1 Mar. 21, 2019

(30) Foreign Application Priority Data

Sep. 20, 2017 (JP) .................................. 2017-180287
Feb. 16, 2018 (JP) .................................. 2018-025759

(51) Int. Cl.
*H01L 29/66* (2006.01)
*H01L 29/73* (2006.01)
(Continued)

(52) U.S. Cl.
CPC ...... *H01L 29/7397* (2013.01); *H01L 27/0629* (2013.01); *H01L 27/0658* (2013.01);
(Continued)

(58) Field of Classification Search
CPC .......... H01L 29/66348; H01L 29/7397; H01L 29/1095; H01L 29/41708; H01L 29/4236;
(Continued)

(56) References Cited

U.S. PATENT DOCUMENTS 6,781,200 B2* 8/2004 Ishimura ............. H01L 29/0696
257/329
7,211,837 B2* 5/2007 Tomomatsu ........ H01L 29/0834
257/156
(Continued)

FOREIGN PATENT DOCUMENTS

JP 2008-305956 A 12/2008
JP 2009-206478 A 9/2009
(Continued)

*Primary Examiner* — Ida M Soward
(74) *Attorney, Agent, or Firm* — Foley & Lardner LLP

(57) ABSTRACT

A semiconductor device according to an embodiment includes a semiconductor layer having a first and a second plane; emitter and collector electrode; a trench gate electrode extending in a first direction substantially parallel to the first plane; a dummy trench gate electrode extending in the first direction; a p base region; an emitter region; an n base region; a collector region; a trench gate insulating film; a dummy trench gate electrode; a dummy trench gate insulating film; a first gate pad electrode connected to the trench gate electrode and the dummy trench gate electrode; a first electric resistor connected between the first gate pad electrode and the trench gate electrode, and a second electric resistor connected between the first gate pad electrode and the dummy trench gate electrode. A CR time constant of the trench gate electrode is less than a CR time constant of the dummy trench gate electrode.

20 Claims, 21 Drawing Sheets

(51) Int. Cl.
*H01L 29/10* (2006.01)
*H01L 29/41* (2006.01)
*H01L 27/06* (2006.01)
*H01L 29/739* (2006.01)
*H01L 29/417* (2006.01)
*H01L 29/423* (2006.01)

(52) U.S. Cl.
CPC ...... *H01L 27/0664* (2013.01); *H01L 29/1095* (2013.01); *H01L 29/41708* (2013.01); *H01L 29/4236* (2013.01); *H01L 29/66348* (2013.01); *H01L 29/7396* (2013.01)

(58) Field of Classification Search
CPC ............. H01L 27/0658; H01L 27/0664; H01L 29/7396
See application file for complete search history.

(56) References Cited

U.S. PATENT DOCUMENTS

| | | | | |
|---|---|---|---|---|
| 7,319,257 B2* | 1/2008 | Yamaguchi | ......... | H01L 29/0696 257/331 |
| 7,615,846 B2* | 11/2009 | Harada | ............... | H01L 29/7397 257/578 |
| 7,675,113 B2* | 3/2010 | Sakamoto | ........... | H01L 29/0696 257/139 |
| 7,955,930 B2* | 6/2011 | Minato | ................. | H01L 29/407 438/270 |
| 8,614,483 B2 | 12/2013 | Tanabe et al. | | |
| 9,023,692 B2 | 5/2015 | Yoshida et al. | | |
| 9,041,051 B2* | 5/2015 | Chen | .................. | H01L 29/7393 257/139 |
| 9,299,819 B2* | 3/2016 | Tang | .................. | H01L 29/7397 |
| 9,466,711 B2* | 10/2016 | Momota | ............. | H01L 29/7395 |
| 9,472,622 B2* | 10/2016 | Lee | .................... | H01L 29/7397 |
| 9,559,171 B2* | 1/2017 | Naito | .................. | H01L 27/0716 |
| 9,601,485 B2* | 3/2017 | Takahashi | ............ | H01L 29/7397 |
| 9,634,130 B2* | 4/2017 | Onozawa | ............ | H01L 29/0661 |
| 9,711,629 B2* | 7/2017 | Ikura | ................... | H01L 29/7397 |
| 9,853,024 B2* | 12/2017 | Senoo | ................. | H01L 27/0664 |
| 9,882,038 B2* | 1/2018 | Schulze | ............ | H01L 29/66333 |
| 9,929,260 B2* | 3/2018 | Naito | .................... | H01L 29/407 |
| 9,947,574 B2* | 4/2018 | Nishikawa | ............ | H01L 29/407 |
| 2009/0283797 A1* | 11/2009 | Takahashi | ............ | H01L 29/7397 257/139 |
| 2011/0193132 A1* | 8/2011 | Kouno | ................ | H01L 29/0619 257/139 |
| 2012/0146091 A1 | 6/2012 | Tanabe et al. | | |
| 2012/0273836 A1* | 11/2012 | Sadamatsu | .......... | H01L 29/0619 257/139 |
| 2015/0129927 A1 | 5/2015 | Sumitomo et al. | | |
| 2016/0268181 A1* | 9/2016 | Yasuhara | ................ | H01L 29/51 |
| 2016/0336393 A1* | 11/2016 | Kim | .................... | H01L 29/0619 |
| 2017/0250269 A1* | 8/2017 | Sumitomo | ............. | H01L 29/78 |
| 2017/0301779 A1* | 10/2017 | Naito | ....................... | H01L 29/78 |
| 2018/0204909 A1* | 7/2018 | Konishi | ................ | H01L 29/739 |
| 2018/0269294 A1* | 9/2018 | Naito | .................... | H01L 23/528 |
| 2018/0301550 A1* | 10/2018 | Sakurai | ................ | H01L 29/739 |
| 2018/0323294 A1* | 11/2018 | Okuda | .................. | H01L 29/739 |
| 2018/0366548 A1* | 12/2018 | Naito | ................ | H01L 21/28512 |

FOREIGN PATENT DOCUMENTS

| | | |
|---|---|---|
| JP | 4398719 B2 | 1/2010 |
| JP | 2012-138567 A | 7/2012 |
| JP | 5228800 B2 | 7/2013 |
| JP | 2013-251296 A | 12/2013 |
| JP | 2013-251395 A | 12/2013 |
| JP | 2014-075582 A | 4/2014 |
| JP | 2014-077582 A | 5/2014 |
| JP | 5493840 B2 | 5/2014 |
| JP | 5594276 B2 | 9/2014 |
| JP | 2014-197702 A | 10/2014 |
| JP | 2014-212160 A | 11/2014 |
| JP | 2016-082167 A | 5/2016 |

* cited by examiner

SEMICONDUCTOR DEVICE WITH INSULATED GATE BIPOLAR TRANSISTOR (IGBT) HAVING MULTIPLE RESISTORS

CROSS-REFERENCE TO RELATED APPLICATION

This application is based upon and claims the benefit of priority from Japanese Patent Application No. 2017-180287, filed on Sep. 20, 2017, and Japanese Patent Application No. 2018-025759, filed on Feb. 16, 2018, the entire contents of which are incorporated herein by reference.

FIELD

Embodiments described herein relate generally to semiconductor devices.

BACKGROUND

An insulated gate bipolar transistor (IGBT) has been known as an example of a power semiconductor device. For example, the IGBT includes a p-type collector region, an n base region, and a p base region which are provided on a collector electrode. In addition, a trench gate electrode is provided in a trench that passes through the p base region and reaches the n base region, with a trench gate insulating film interposed therebetween. Furthermore, an emitter region connected to an emitter electrode is provided in a region that is adjacent to the trench in the surface of the p base region.

In the IGBT, a positive voltage is applied to a gate electrode to form a channel in the p base region. Then, holes are injected from the collector region to the n base region at the same time as electrons are injected from the emitter region to the n base region. Then, a current flows between the collector electrode and the emitter electrode.

A method for preventing holes from being emitted from the n base region has been known in order to reduce on-resistance between the collector electrode and the emitter electrode of the IGBT. In this method, the emission of holes from the n base region to the emitter electrode is prevented to increase the relative number of electrons injected and to reduce the on-resistance of the IGBT.

For example, in order to achieve the method, a thinning out-type IGBT has been proposed in which a dummy trench gate electrode that does not contribute to the formation of a channel is provided between trench gate electrodes. It is preferable to achieve a thinning out-type IGBT with improved characteristics such as a high switching speed and low on-resistance.

DETAILED DESCRIPTION

Figure 1:
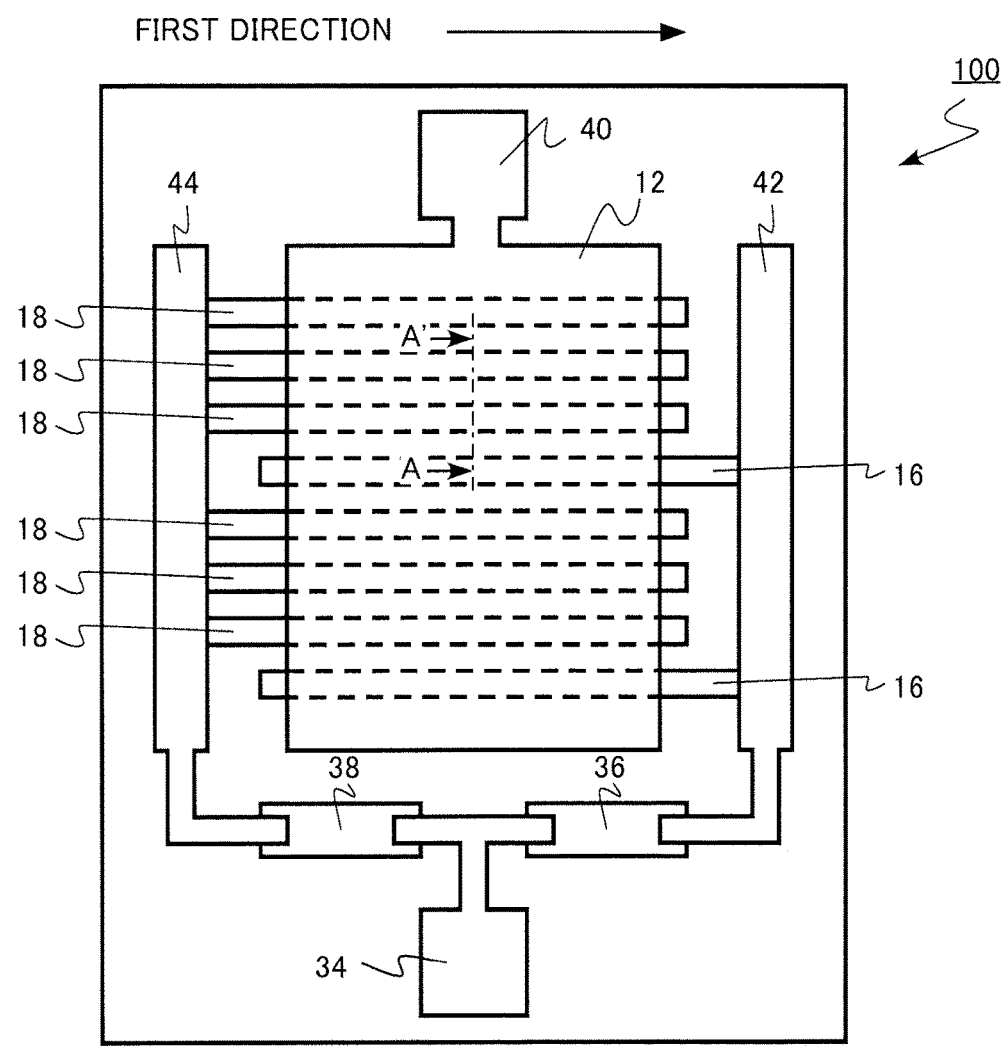
FIG. 1 is a plan view schematically illustrating a semiconductor device according to a first embodiment.

Hereinafter, embodiments of the invention will be described with reference to the drawings. In the following description, for example, the same members are denoted by the same reference numerals and the description of the members that have been described once will not be repeated.

In the following description, when conductivity types are represented by $n^+$, n, and $n^-$, $n^+$ indicates the highest n-type impurity concentration, followed by n and $n^-$. In addition, when conductivity types are represented by $p^+$, p, and $p^-$, $p^+$ indicates the highest p-type impurity concentration, followed by p and $p^-$.

First Embodiment

A semiconductor device according to this embodiment includes: a semiconductor layer having a first plane and a second plane opposite to the first plane; an emitter electrode, at least a portion of the emitter electrode being in contact with the first plane; a collector electrode, at least a portion of the collector electrode being in contact with the second plane; a trench gate electrode provided in the semiconductor layer, the trench gate electrode extending in a first direction substantially parallel to the first plane; a dummy trench gate electrode provided in the semiconductor layer, the dummy trench gate electrode extending in the first direction; a p base region provided in the semiconductor layer; an n-type emitter region provided between the p base region and the first plane in the semiconductor layer, the n-type emitter region being electrically connected to the emitter electrode; an n base region provided between the p base region and the second plane in the semiconductor layer; a p-type collector region provided between the n base region and the second plane in the semiconductor layer, the p-type collector region being electrically connected to the collector electrode; a trench gate insulating film provided between the trench gate electrode and the p base region, between the trench gate electrode and the emitter region, and between the trench gate electrode and the n base region, the trench gate insulating film being in contact with the p base region, the emitter region, and the n base region; a dummy trench gate insulating film provided between the dummy trench gate electrode and the p base region and between the dummy trench gate electrode and then base region, the dummy trench gate insulating film being in contact with the p base region and the n base region; a first gate pad electrode electrically connected to the trench gate electrode and the dummy trench gate electrode; a first electric resistor electrically connected between the first gate pad electrode and the trench gate electrode; and a second electric resistor electrically connected between the first gate pad electrode and the dummy trench gate electrode. A CR time constant of the trench gate electrode is less than a CR time constant of the dummy trench gate electrode.

Figure 2A:
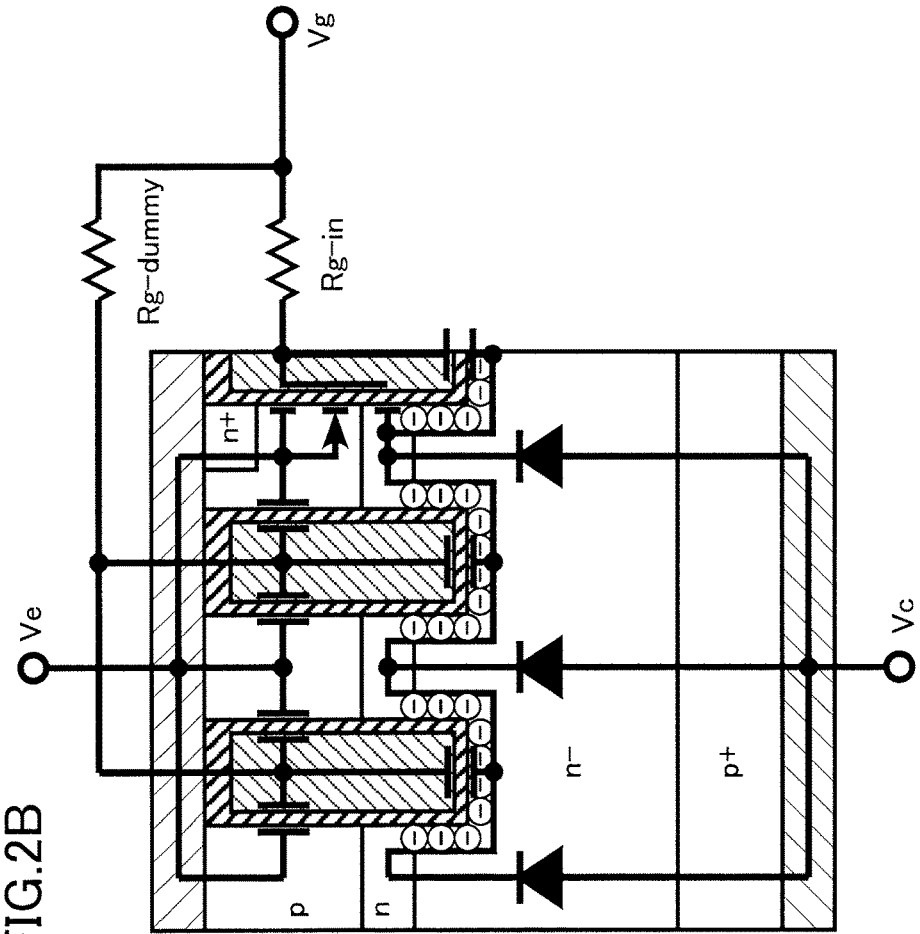
FIGS. 2A and 2B are cross-sectional views schematically illustrating the semiconductor device according to the first embodiment.
Figure 2B:
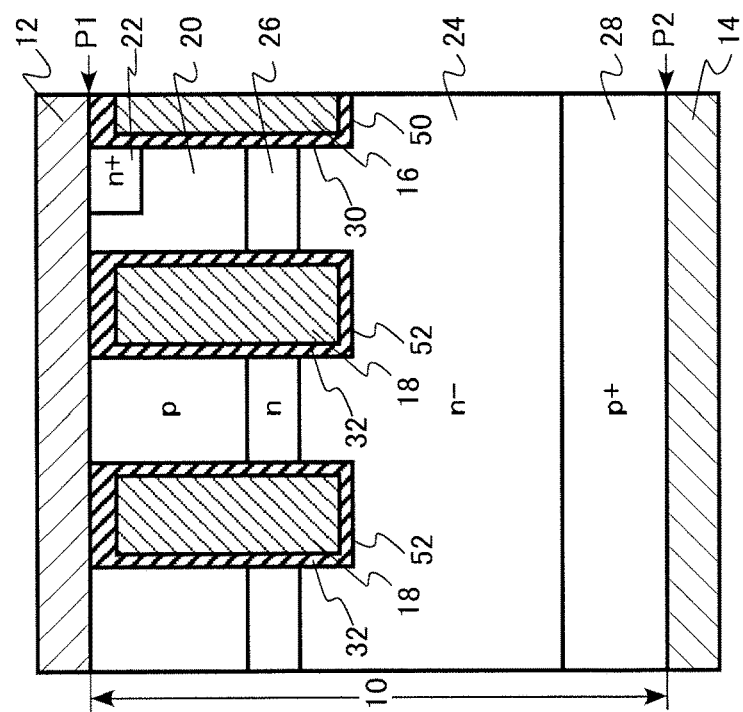

FIG. 1 is a plan view schematically illustrating the semiconductor device according to this embodiment. FIGS. 2A and 2B are cross-sectional views schematically illustrating the semiconductor device according to this embodiment. FIG. 2A is a cross-sectional view taken along the line AA' of FIG. 1. FIG. 2B is a diagram in which an equivalent circuit is overwritten on FIG. 2A.

The semiconductor device according to this embodiment is a trench IGBT 100 in which a gate electrode is provided in a trench formed in a semiconductor layer. The trench IGBT 100 is a thinning out-type IGBT having a dummy trench gate electrode.

The trench IGBT 100 according to this embodiment includes a semiconductor layer 10, an emitter electrode 12, a collector electrode 14, a trench gate electrode 16, a dummy trench gate electrode 18, a p base region 20, an emitter region 22, an n base region 24, a barrier region 26 (n-type semiconductor region), a collector region 28, a trench gate insulating film 30, a dummy trench gate insulating film 32, a gate pad electrode 34 (first gate pad electrode), an internal gate resistor 36 (first electric resistor), a dummy gate resistor 38 (second electric resistor), an emitter pad electrode 40, a gate electrode connection wire 42 (first connection wire), a dummy gate electrode connection wire 44 (second connection wire), a trench 50, and a dummy trench 52.

The semiconductor layer 10 has a first plane P1 and a second plane P2 that is opposite to the first plane P1. The semiconductor layer 10 is made of, for example, single-crystal silicon. The thickness of the semiconductor layer 10 is, for example, equal to or greater than 50 μm and equal to or less than 700 μm.

At least a portion of the emitter electrode 12 comes into contact with the first plane P1 of the semiconductor layer 10. The emitter electrode 12 is made of, for example, metal. An emitter voltage (Ve) is applied to the emitter electrode 12. The emitter voltage is, for example, 0 V.

At least a portion of the collector electrode 14 comes into contact with the second plane P2 of the semiconductor layer 10. The collector electrode 14 is made of, for example, metal. A collector voltage (Vc) is applied to the collector electrode 14. The collector voltage is, for example, equal to or greater than 200 V and equal to or less than 6500 V.

A plurality of trench gate electrodes 16 are provided in the semiconductor layer 10. The trench gate electrode 16 is provided in the trench 50 formed in the semiconductor layer 10. The trench gate electrode 16 extends in a first direction that is substantially parallel to the first plane P1. The trench gate electrode 16 is made of, for example, polysilicon including n-type impurities or p-type impurities.

A plurality of dummy trench gate electrodes 18 are provided in the semiconductor layer 10. The dummy trench gate electrode 18 is provided in the dummy trench 52 formed in the semiconductor layer 10. The dummy trench gate electrode 18 extends in the first direction that is substantially parallel to the first plane P1. The dummy trench gate electrode 18 is provided between the trench gate electrodes 16 so as to be parallel to the trench gate electrodes 16. The dummy trench gate electrode 18 is made of, for example, polysilicon including n-type impurities or p-type impurities.

The p base region 20 is provided in the semiconductor layer 10. The p base region 20 is a p-type semiconductor region. A portion of the p base region 20 which comes into contact with the trench gate insulating film 30 functions as a channel region of the trench IGBT 100.

The emitter region 22 is provided in the semiconductor layer 10. The emitter region 22 is provided between the p base region 20 and the first plane P1 and comes into contact with the trench gate insulating film 30. The emitter region 22 is an n-type semiconductor region. The emitter region 22 is not provided between two dummy trench gate electrodes 18. The emitter region 22 is electrically connected to the emitter electrode 12.

The n base region 24 is provided in the semiconductor layer 10. The n base region 24 is provided between the p base region 20 and the second plane. The n base region 24 is an n-type semiconductor region.

The barrier region 26 is provided in the semiconductor layer 10. The barrier region 26 is provided between the p base region 20 and the n base region 24. The barrier region 26 is an n-type semiconductor region. The n-type impurity concentration of the barrier region 26 is higher than the n-type impurity concentration of the n base region 24. The n-type impurity concentration of the barrier region 26 is lower than the n-type impurity concentration of the emitter region 22. The barrier region 26 has a function of reducing the on-resistance of the trench IGBT 100.

The collector region 28 is provided in the semiconductor layer 10. The collector region 28 is provided between the n base region 24 and the second plane P2. The collector region 28 is a p-type semiconductor region. The p-type impurity concentration of the collector region 28 is higher than the p-type impurity concentration of the p base region 20. The collector region 28 is electrically connected to the collector electrode 14.

A buffer region having a higher n-type impurity concentration than the n base region 24 may be provided between the n base region 24 and the collector region 28. The provision of the buffer region makes it possible to prevent the spreading of a depletion layer when the trench IGBT 100 is turned off.

The trench gate insulating film 30 is provided between the trench gate electrode 16 and the p base region 20, between the trench gate electrode 16 and the emitter region 22, and between the trench gate electrode 16 and the n base region 24. The trench gate insulating film 30 is provided in the trench 50. The trench gate insulating film 30 comes into contact with the p base region 20, the emitter region 22, and the n base region 24. The trench gate insulating film 30 is made of, for example, silicon oxide.

The dummy trench gate insulating film 32 is provided between the dummy trench gate electrode 18 and the p base region 20 and between the dummy trench gate electrode 18 and the n base region 24. The dummy trench gate insulating film 32 is provided in the dummy trench 52. The dummy trench gate insulating film 32 comes into contact with the p base region 20 and the n base region 24. The dummy trench gate insulating film 32 does not come into contact with the emitter region 22. The dummy trench gate insulating film 32 is made of, for example, silicon oxide.

The gate pad electrode 34 is provided on the semiconductor layer 10. The gate pad electrode 34 is provided on the side of the first plane P1 of the semiconductor layer 10. The gate pad electrode 34 is electrically connected to the trench gate electrode 16 and the dummy trench gate electrode 18. The gate pad electrode 34 is made of, for example, metal.

The internal gate resistor 36 is provided on the semiconductor layer 10. The internal gate resistor 36 is provided on the side of the first plane P1 of the semiconductor layer 10. The internal gate resistor 36 is electrically connected between the gate pad electrode 34 and the trench gate electrode 16.

The internal gate resistor 36 is made of, for example, a semiconductor. The internal gate resistor 36 is made of, for example, polysilicon including conductive impurities. The internal gate resistor 36 is made of, for example, a material having a higher resistivity than the gate electrode connection wire 42.

The dummy gate resistor 38 is provided on the semiconductor layer 10. The dummy gate resistor 38 is provided on the side of the first plane P1 of the semiconductor layer 10. The dummy gate resistor 38 is electrically connected between the gate pad electrode 34 and the dummy trench gate electrode 18.

The dummy gate resistor 38 is made of, for example, a semiconductor. The dummy gate resistor 38 is made of, for example, polysilicon including conductive impurities. The dummy gate resistor 38 is made of, for example, a material having a higher resistivity than the dummy gate electrode connection wire 44.

The gate electrode connection wire 42 is electrically connected between the trench gate electrode 16 and the internal gate resistor 36. The gate electrode connection wire 42 is connected to an end portion of the trench gate electrode 16. For example, the gate electrode connection wire 42 is connected to the trench gate electrode 16 by a contact portion (not illustrated). The gate electrode connection wire 42 is made of, for example, metal.

The dummy gate electrode connection wire 44 is electrically connected between the dummy trench gate electrode 18 and the dummy gate resistor 38. The dummy gate electrode connection wire 44 is connected to an end portion of the dummy trench gate electrode 18. For example, the dummy gate electrode connection wire 44 is connected to the dummy trench gate electrode 18 by a contact portion (not illustrated). The dummy gate electrode connection wire 44 is made of, for example, metal.

The trench gate electrode 16 and the dummy trench gate electrode 18 are located between the gate electrode connection wire 42 and the dummy gate electrode connection wire 44. In other words, the gate electrode connection wire 42 is located at one end portion of each of the trench gate electrode 16 and the dummy trench gate electrode 18 and the dummy gate electrode connection wire 44 is located at the other end portion of each of the trench gate electrode 16 and the dummy trench gate electrode 18.

A CR time constant of the trench gate electrode 16 is less than a CR time constant of the dummy trench gate electrode 18. The CR time constant of the trench gate electrode 16 is mainly defined by the capacitance between the trench gate electrode 16 and the semiconductor layer 10, a resistance value of the trench gate electrode 16, and a resistance value of the internal gate resistor 36. The CR time constant of the dummy trench gate electrode 18 is mainly defined by the capacitance between the dummy trench gate electrode 18 and the semiconductor layer 10, a resistance value of the dummy trench gate electrode 18, and a resistance value of the dummy gate resistor 38.

The emitter pad electrode 40 is provided on the semiconductor layer 10. The emitter pad electrode 40 is provided on the side of the first plane P1 of the semiconductor layer 10. The emitter pad electrode 40 is electrically connected to the emitter electrode 12.

The trench IGBT 100 is a three-terminal device having three electrodes, that is, the emitter pad electrode 40, the collector electrode 14, and the gate pad electrode 34 as terminals.

As illustrated in FIG. 2B, in the trench IGBT 100 according to this embodiment, an internal gate resistor (Rg-in) and a dummy gate resistor (Rg-dummy) are connected in parallel to each other. For example, the internal gate resistor (Rg-in) and the dummy gate resistor (Rg-dummy) are connected to a gate driver through an external gate resistor outside the trench IGBT 100. The gate driver applies a gate voltage (Vg) to the trench gate electrode 16 and the dummy trench gate electrode 18.

The internal gate resistor (Rg-in) corresponds to the internal gate resistor 36 illustrated in FIG. 1. The dummy gate resistor (Rg-dummy) corresponds to the dummy gate resistor 38 illustrated in FIG. 1.

For example, the p base region 20 is electrically connected to the emitter electrode 12. For example, the p base region 20 is fixed to a ground potential. The p base region 20 interposed between the dummy trench gate electrodes 18 may be, for example, a floating region.

Next, the function and effect of the trench IGBT 100 according to this embodiment will be described.

Figure 3:
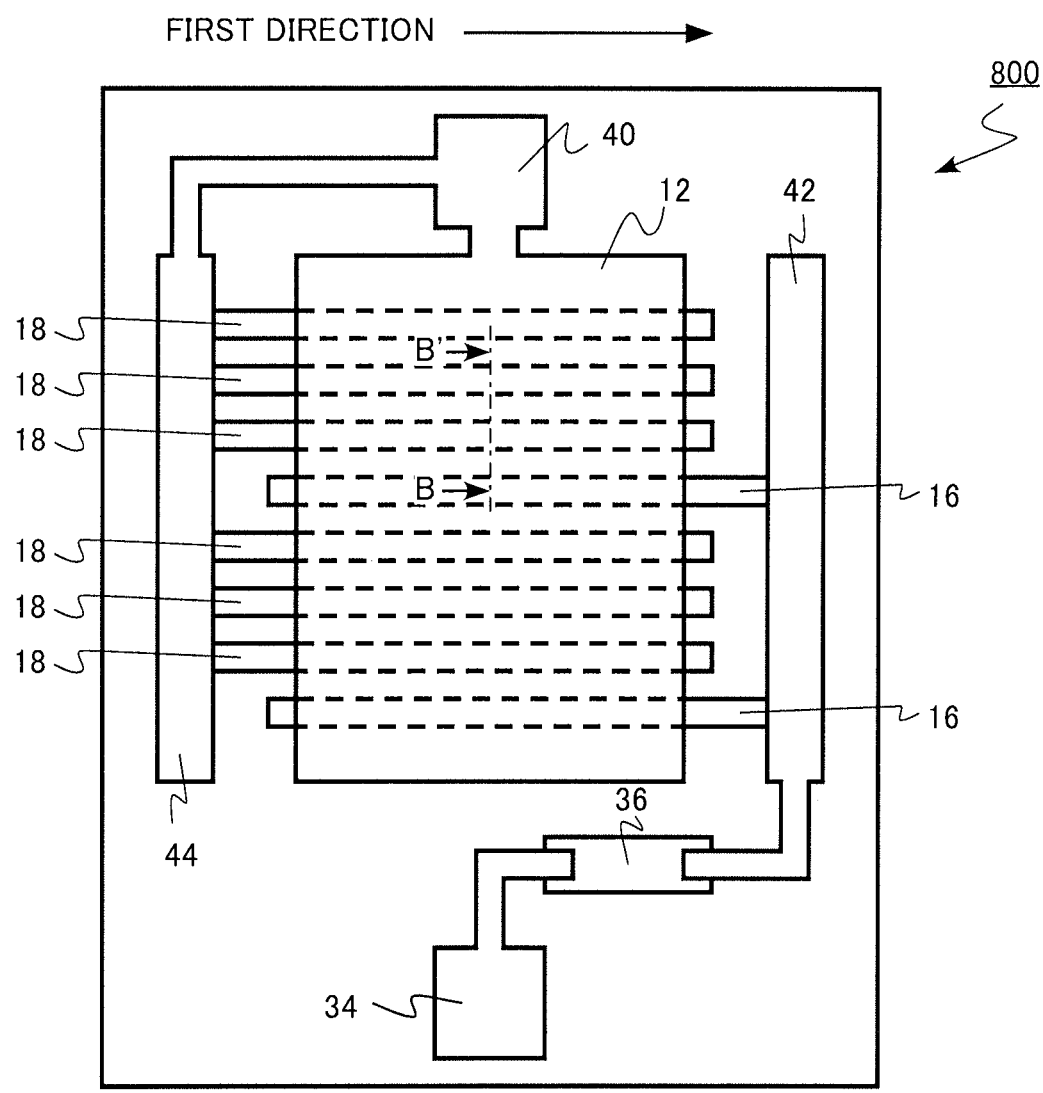
FIG. 3 is a plan view schematically illustrating a semiconductor device according to a first comparative example.
Figure 4A:
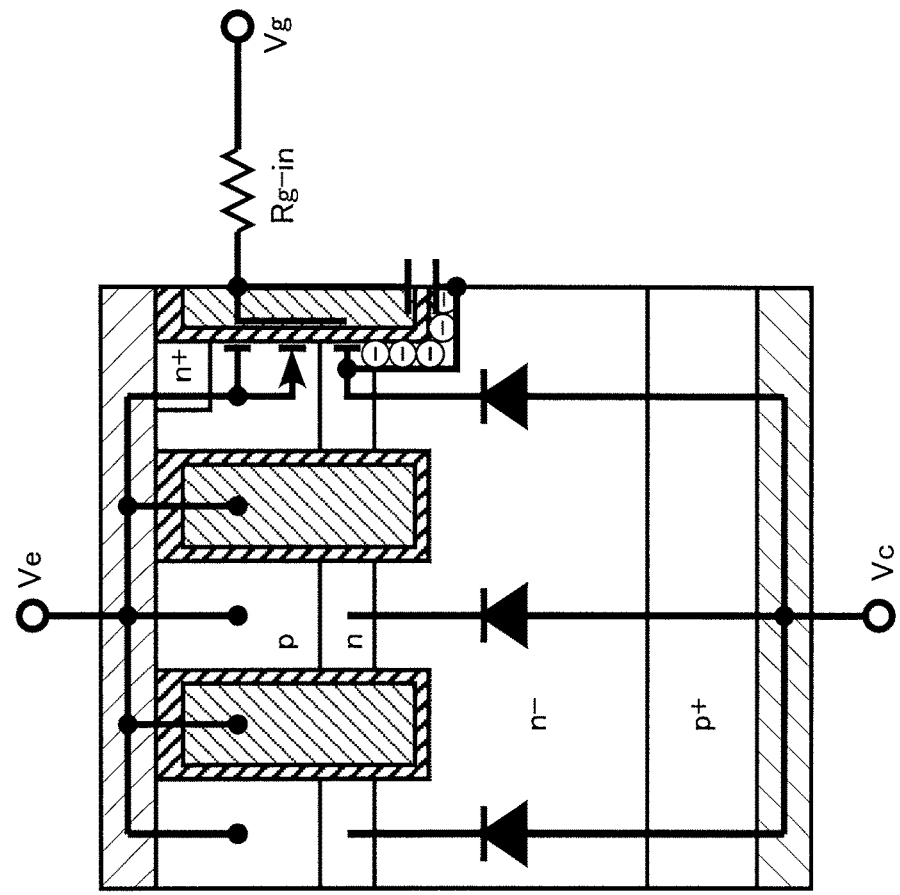
FIGS. 4A and 4B are cross-sectional views schematically illustrating the semiconductor device according to the first comparative example.
Figure 4B:
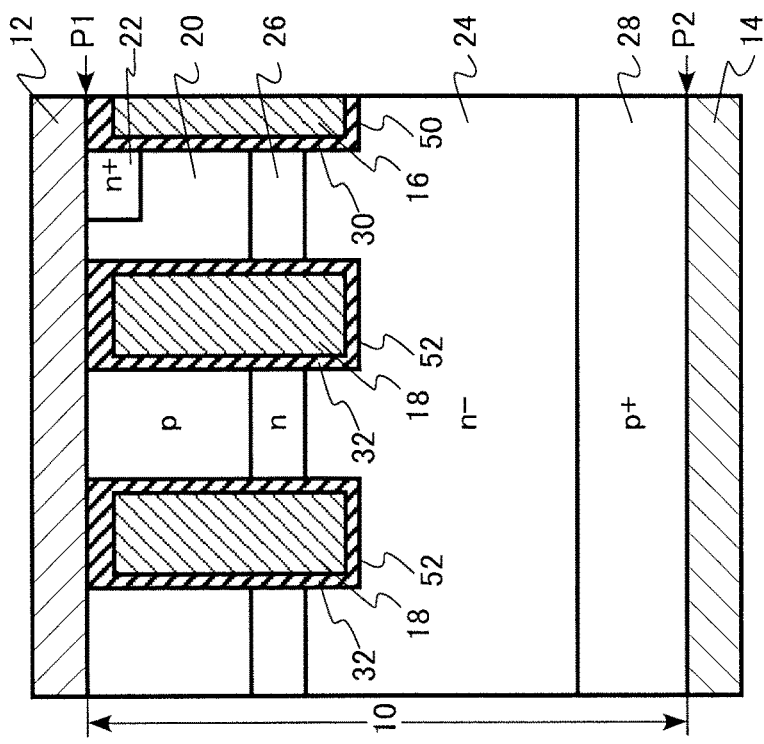

FIG. 3 is a plan view schematically illustrating a semiconductor device according to a first comparative example. FIGS. 4A and 4B are cross-sectional views schematically illustrating the semiconductor device according to the first comparative example. FIG. 4A is a cross-sectional view taken along the line BB' of FIG. 3. FIG. 4B is a diagram in which an equivalent circuit is overwritten on FIG. 4A.

The semiconductor device according to the first comparative example is a trench IGBT 800 in which a gate electrode is provided in a trench formed in a semiconductor layer. The trench IGBT 800 is a thinning out-type IGBT including a dummy trench gate electrode.

The trench IGBT 800 differs from the trench IGBT 100 according to the embodiment in that the dummy trench gate electrode 18 is electrically connected to the emitter electrode 12 and the dummy gate resistor 38 is not provided.

The dummy trench gate electrode 18 of the trench IGBT 800 is electrically connected to the emitter electrode 12. An emitter voltage (Ve) is applied to the dummy trench gate electrode 18. The emitter voltage is, for example, 0 V. Therefore, an electron accumulation layer is not formed in the n base region 24 in the vicinity of the bottom of the dummy trench 52.

As can be seen from FIG. 4B, since the electron accumulation layer is not formed in the n base region 24 in the vicinity of the bottom of the dummy trench 52, a parasitic pn diode that is provided between the dummy trench gate electrodes 18 and is formed by the collector region 28, the n base region 24, and the barrier region 26 is separated from a transistor that has the trench gate electrode 16 as a gate in terms of a circuit. Therefore, the carrier concentration of the n base region 24 does not increase and the parasitic pn diode does not effectively contribute to an on-current path. As a result, it is difficult to reduce the on-resistance of the trench IGBT 800. In other words, a saturation voltage (Vce (sat)) of a collector-emitter voltage (Vce) increases.

Figure 5:
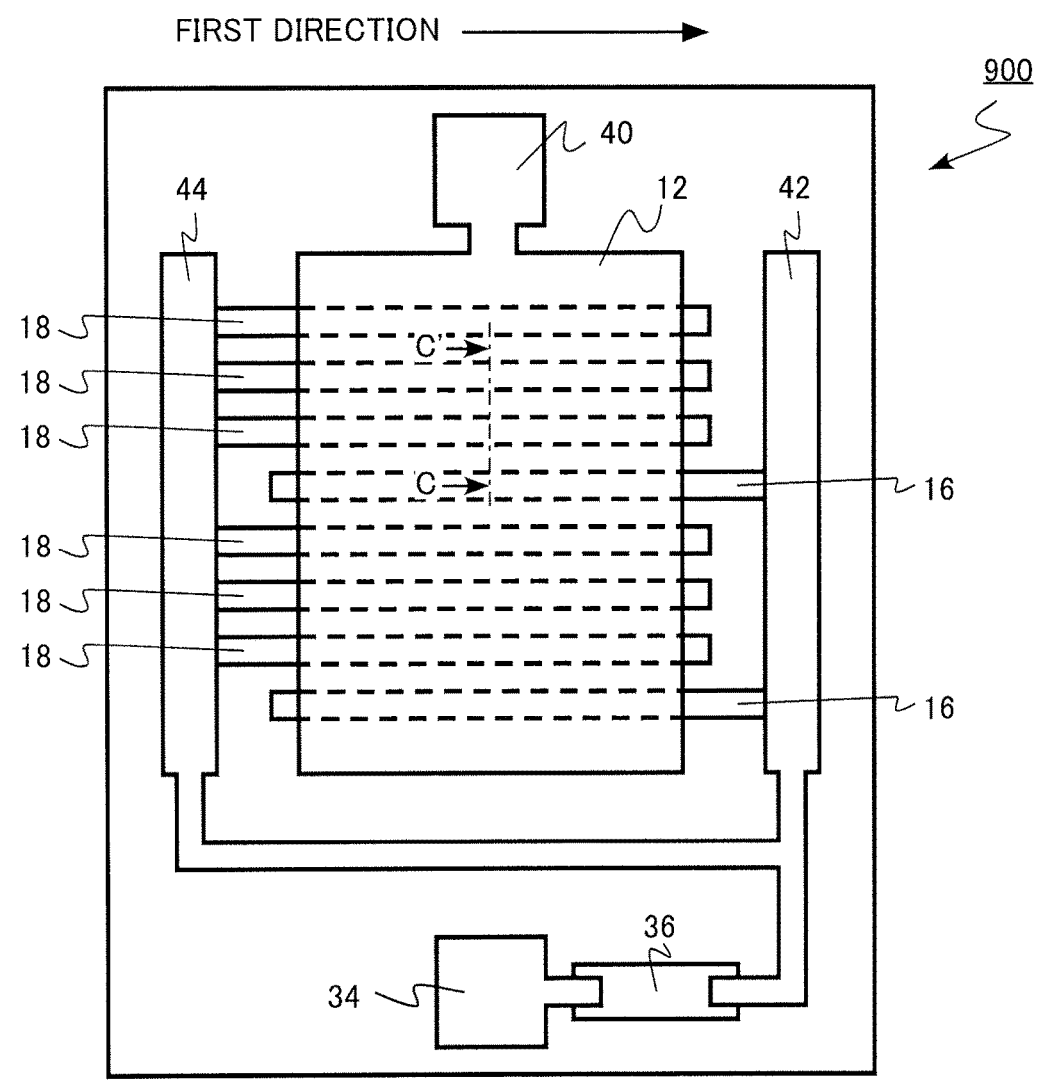
FIG. 5 is a plan view schematically illustrating a semiconductor device according to a second comparative example.
Figure 6B:
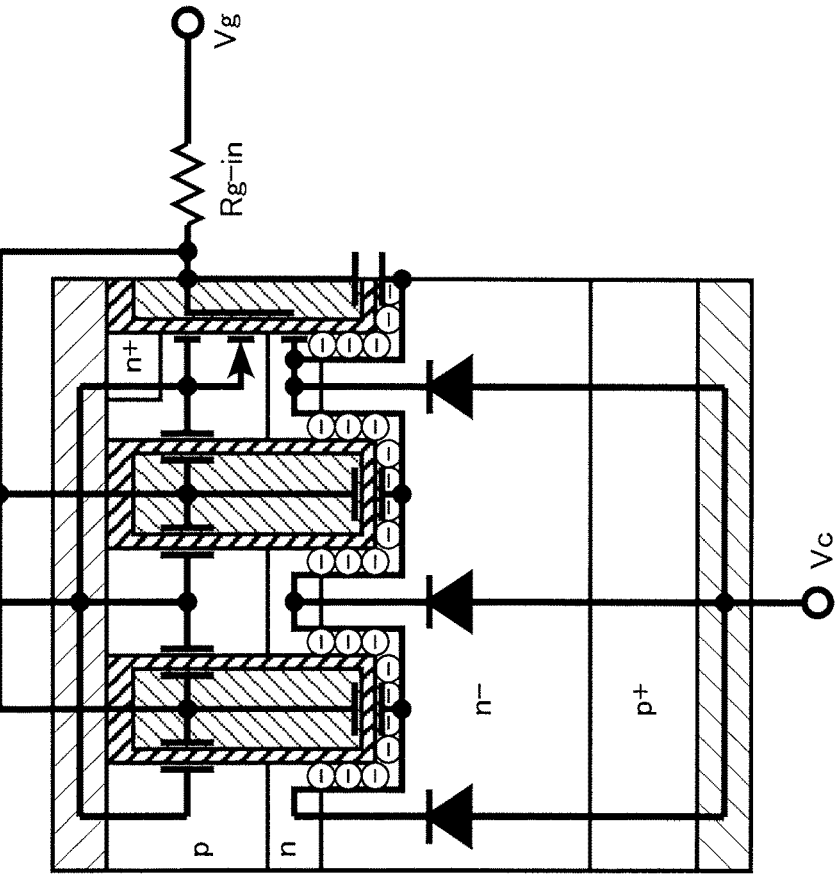
FIGS. 6A and 6B are cross-sectional views schematically illustrating the semiconductor device according to the second comparative example.
Figure 6A:
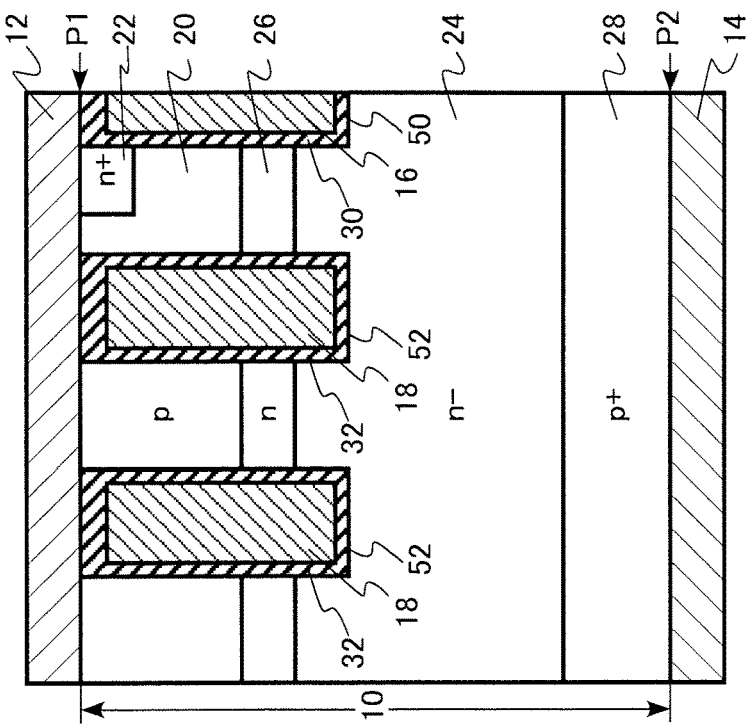

FIG. 5 is a plan view schematically illustrating a semiconductor device according to a second comparative example. FIGS. 6A and 6B are cross-sectional views schematically illustrating the semiconductor device according to the second comparative example. FIG. 6A is a cross-sectional view taken along the line CC' of FIG. 5. FIG. 6B is a diagram in which an equivalent circuit is overwritten on FIG. 6A.

The semiconductor device according to the second comparative example is a trench IGBT 900 in which a gate electrode is provided in a trench formed in a semiconductor layer. The trench IGBT 900 is a thinning out-type IGBT including a dummy trench gate electrode.

The trench IGBT 900 differs from the trench IGBT 800 according to the first comparative example in that the dummy trench gate electrode 18 is electrically connected to the trench gate electrode 16.

When the trench IGBT 900 is turned on, a gate voltage (Vg) is applied to the dummy trench gate electrode 18 of the trench IGBT 900, similarly to the trench gate electrode 16. Therefore, an electron accumulation layer is formed in the n base region 24 in the vicinity of the bottom of the dummy trench 52.

As can be seen from FIG. 6B, since the electron accumulation layer is formed, a parasitic pn diode that is provided between the dummy trench gate electrodes 18 and is formed by the collector region 28, the n base region 24, and the barrier region 26 is connected to a transistor that has the trench gate electrode 16 as a gate in terms of a circuit. Therefore, the carrier concentration of the n base region 24 increases and the parasitic pn diode effectively contributes to an on-current path. As a result, the on-resistance of the trench IGBT 900 is reduced. In other words, a saturation voltage (Vce (sat)) of a collector-emitter voltage (Vce) is reduced. In a case in which n-type impurity concentration is higher than that of the n base region 24 and the barrier region 26 with low resistance is provided, on-resistance is particularly reduced.

In contrast, in the trench IGBT 900, since the dummy trench gate electrode 18 is electrically connected to the trench gate electrode 16, gate capacitance is high. Therefore, the CR time constant of the gate electrode is large. As a result, a switching speed is reduced.

In addition, since gate capacitance is high, the nonlinearity of the switching speed with respect to an external gate resistor that is provided outside the trench IGBT 900 increases. Therefore, it is difficult to adjust the switching speed using the external gate resistor.

In the trench IGBT 100 according to this embodiment, a gate resistor provided in a semiconductor chip is divided into two gate resistors, that is, the internal gate resistor 36 and the dummy gate resistor 38. Only the internal gate resistor 36 is electrically connected between the gate pad electrode 34 and the trench gate electrode 16 and only the dummy gate resistor 38 is electrically connected between the gate pad electrode 34 and the dummy trench gate electrode 18.

Since the gate resistor is divided into two gate resistors, that is, the internal gate resistor 36 and the dummy gate resistor 38, a current that flows to the trench gate electrode 16 and a current that flows to the dummy trench gate electrode 18 can be controlled by the resistance values of the internal gate resistor 36 and the dummy gate resistor 38. The ratio of the resistance value of the internal gate resistor 36 to the resistance value of the dummy gate resistor 38 can be changed to control the ratio of the amount of current flowing to the trench gate electrode 16 to the amount of current flowing to the dummy trench gate electrode 18. For example, the resistance value of the internal gate resistor 36 can be reduced to increase the amount of current flowing to the trench gate electrode 16.

For example, the resistance values of the internal gate resistor 36 and the dummy gate resistor 38 are adjusted such that the CR time constant of the trench gate electrode 16 is less than the CR time constant of the dummy trench gate electrode 18. Then, the trench gate electrode 16 can be charged and discharged earlier than the dummy trench gate electrode 18. Therefore, it is possible to improve the switching speed of the trench IGBT 100.

When the trench IGBT 100 is turned on, the dummy trench gate electrode 18 is charged to the gate voltage (Vg) later than the trench gate electrode 16. Therefore, similarly to the second comparative example, an electron accumulation layer is formed in the n base region 24 in the vicinity of the bottom of the dummy trench 52 and on-resistance is reduced.

Figure 7:
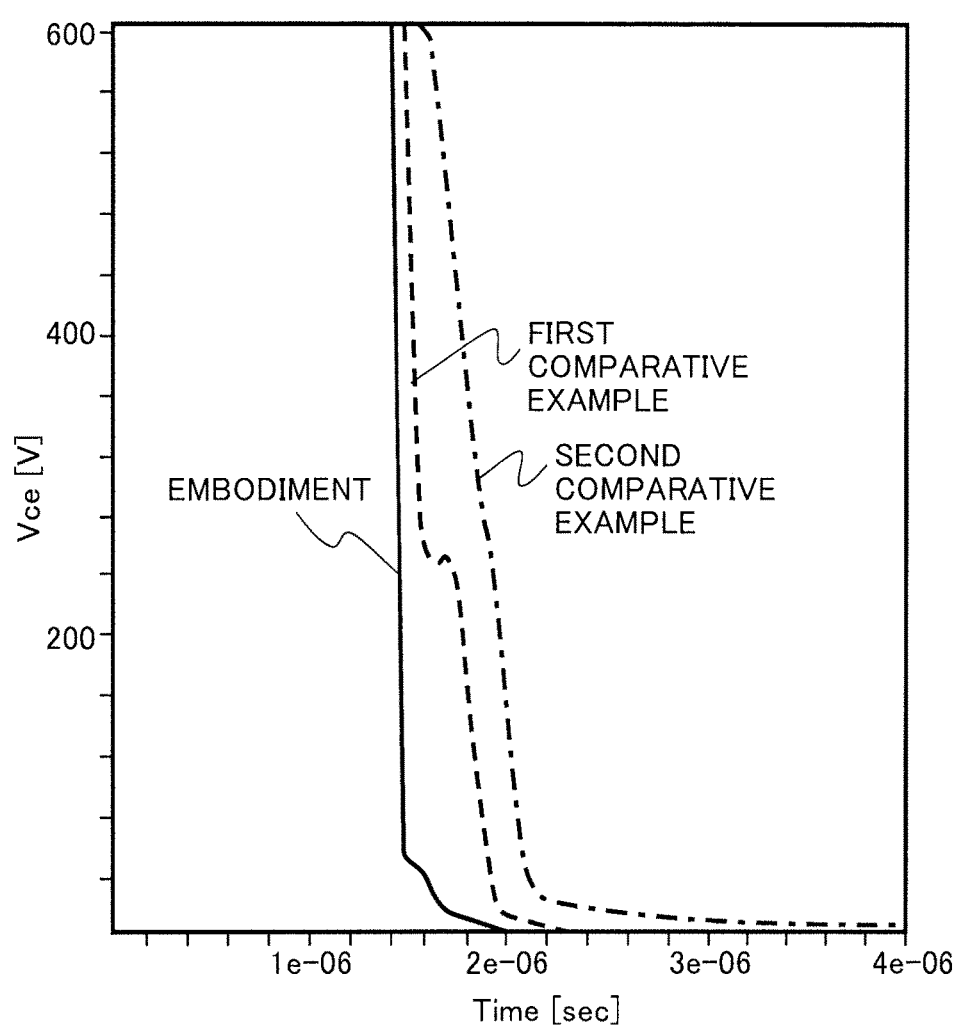
FIG. 7 is a diagram illustrating the function and effect of the semiconductor device according to the first embodiment.

FIG. 7 is a diagram illustrating the function and effect of the semiconductor device according to this embodiment. FIG. 7 is a diagram illustrating a change in the collector-emitter voltage (Vce) with respect to time when the IGBT is turned on.

In the trench IGBT 900 according to the second comparative example, since a turn-on speed is lower than that of the trench IGBT 800 according to the first comparative example, the decrease rate of the collector-emitter voltage is lower than that in the trench IGBT 800. The reason is that the dummy trench gate electrode 18 is connected to the trench gate electrode 16 and it takes time to charge the dummy trench gate electrode 18 and the trench gate electrode 16.

In the trench IGBT 800 according to the first comparative example, a waveform has a step-shape portion. It is considered that the reason is as follows: since the parasitic pn diode formed by the collector region 28, the n base region 24, and the barrier region 26 is separated from the transistor having the trench gate electrode 16 as the gate in terms of a circuit, holes are likely to move to the emitter electrode 12 and the accumulation of carriers is delayed.

In the trench IGBT 100 according to this embodiment, since the gate resistor is divided into two gate resistors, that is, the internal gate resistor 36 and the dummy gate resistor 38, the trench gate electrode 16 can be charged earlier than the dummy trench gate electrode 18. In addition, since the parasitic pn diode formed by the collector region 28, the n base region 24, and the barrier region 26 is connected to the transistor having the trench gate electrode 16 as the gate in terms of a circuit, the delay of the accumulation of carriers is less likely to occur. Therefore, the turn-on speed is higher than that in the first comparative example and the second comparative example.

When the trench IGBT 100 according to this embodiment is turned off, the trench gate electrode 16 can be discharged earlier than the dummy trench gate electrode 18. Therefore, a turn-off speed is also higher than that in the first comparative example and the second comparative example.

Figure 8B:
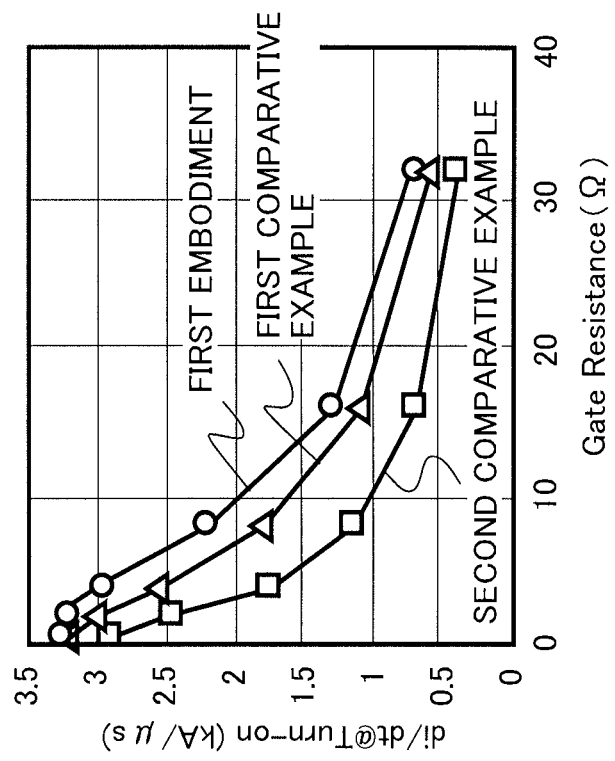
FIGS. 8A and 8B are diagrams illustrating the function and effect of the semiconductor device according to the first embodiment.
Figure 8A:
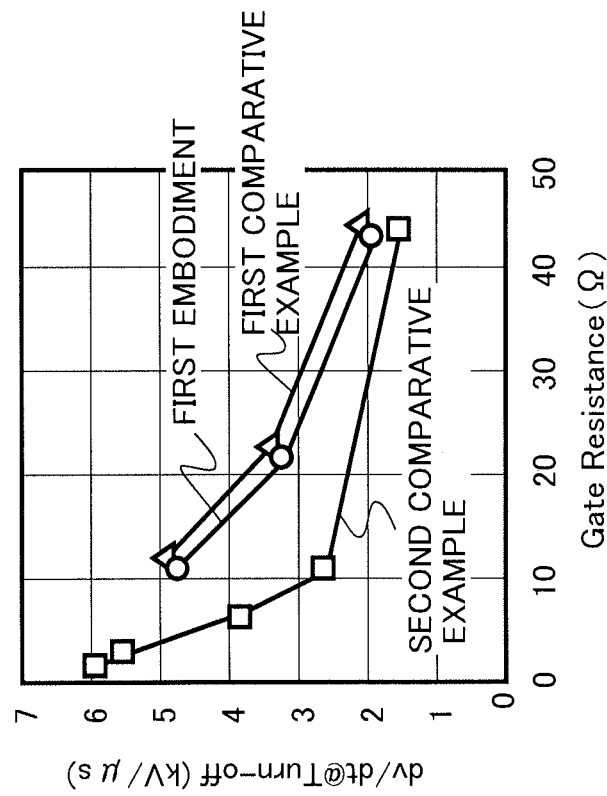

FIGS. 8A and 8B are diagrams illustrating the function and effect of the semiconductor device according to this embodiment. FIG. 8A is a diagram illustrating a relationship between gate resistance and the time rate of change in the collector-emitter voltage (Vce) (dV/dt) when the IGBT is turned off. FIG. 8B is a diagram illustrating a relationship between the gate resistance and the time rate of change in a collector-emitter current (di/dt) when the IGBT is turned on. The resistance value of the gate resistor is the resistance value of the external gate resistor that is provided outside the IGBT. The time rate of change in the collector-emitter voltage (Vce) (dV/dt) and the time rate of change in the collector-emitter current (di/dt) are indexes indicating the switching speeds when the IGBT is turned off and when the IGBT is turned on.

As can be seen from FIGS. 8A and 8B, in the second comparative example, the non-linearity of the time rate of change in the collector-emitter voltage (Vce) (dV/dt) and the time rate of change in the collector-emitter current (di/dt) is large. It is considered that the reason is as follows: since the dummy trench gate electrode 18 is connected to the trench gate electrode 16, gate mirror capacitance is high; and since the non-linearity is large, the controllability of the switching speed by the external gate resistor is reduced.

In this embodiment, linearity that is substantially the same as that in the first comparative example is obtained. It is considered that the reason is as follows: since the trench gate electrode 16 is charged and discharged earlier than the dummy trench gate electrode 18, the influence of the connection between the dummy trench gate electrode 18 and the trench gate electrode 16 is small. Therefore, the controllability of the switching speed by the external gate resistor is high.

In addition, in the trench IGBT 900 according to the second comparative example, the problem of gate oscillation caused by gate negative capacitance or gate voltage overshoot/undershoot is likely to occur. It is considered that the reason is as follows: since the dummy trench gate electrode 18 is directly connected to the trench gate electrode 16, parasitic capacitance formed by the dummy trench gate electrode and the collector electrode is directly transmitted to the trench gate electrode 16.

According to the trench IGBT 100 of this embodiment, it is possible to independently reduce the CR time constant of the trench gate electrode 16. Therefore, the problem of gate oscillation caused by gate negative capacitance or gate voltage overshoot/undershoot is prevented.

As illustrated in FIG. 1, preferably, the gate electrode connection wire 42 and the dummy gate electrode connection wire 44 are provided such that the trench gate electrode 16 and the dummy trench gate electrode 18 are located between the gate electrode connection wire 42 and the dummy gate electrode connection wire 44. In other words, it is preferable that the trench gate electrode 16 and the dummy trench gate electrode 18 be provided so as to be interposed between the gate electrode connection wire 42 and the dummy gate electrode connection wire 44.

For example, this configuration makes it possible to prevent wires from intersecting with each other and makes it easy to draw the gate electrode connection wire 42 and the dummy gate electrode connection wire 44. Therefore, for example, it is possible to reduce the area of a chip or to simplify a manufacturing process.

As described above, according to the trench IGBT 100 of this embodiment, it is possible to achieve an IGBT with low on-resistance and a high switching speed. In addition, it is possible to achieve an IGBT that can prevent the oscillation of a gate voltage or gate voltage overshoot/undershoot. Furthermore, it is possible to reduce the area of a chip or to simplify a manufacturing process.

Second Embodiment

A semiconductor device according to this embodiment includes: a semiconductor layer having a first plane and a second plane opposite to the first plane; a first emitter electrode, at least a portion of the first emitter electrode being in contact with the first plane; a first collector electrode, at least a portion of the first collector electrode being in contact with the second plane; a first trench gate electrode provided in the semiconductor layer, the first trench gate electrode extending in a first direction substantially parallel to the first plane; a first dummy trench gate electrode provided in the semiconductor layer, the first dummy trench gate electrode extending in the first direction; a first p base region provided in the semiconductor layer; an n-type first emitter region provided between the first p base region and the first plane in the semiconductor layer, the n-type first emitter region being electrically connected to the first emitter electrode; a first n base region provided between the first p base region and the second plane in the semiconductor layer; a p-type first collector region provided between the first n base region and the second plane in the semiconductor layer, the p-type first collector region being electrically connected to the first collector electrode; a first trench gate insulating film provided between the first trench gate electrode and the first p base region, between the first trench gate electrode and the first emitter region, and between the first trench gate electrode and the first n base region, the first trench gate insulating film being in contact with the first p base region, the first emitter region, and the first n base region; a first dummy trench gate insulating film provided between the first dummy trench gate electrode and the first p base region and between the first dummy trench gate electrode and the first n base region, the first dummy trench gate insulating film being in contact with the first p base region and the first n base region; a second emitter electrode, at least a portion of the second emitter electrode being in contact with the first plane; a second collector electrode, at least a portion of the second collector electrode being in contact with the second plane; a second trench gate electrode provided in the semiconductor layer, the second trench gate electrode extending in the first direction substantially parallel to the first plane; a second dummy trench gate electrode provided in the semiconductor layer, the second dummy trench gate electrode extending in the first direction; a second p base region provided in the semiconductor layer; an n-type second emitter region provided between the second p base region and the first plane in the semiconductor layer, the n-type second emitter region being electrically connected to the second emitter electrode; a second n base region provided between the second p base region and the second plane in the semiconductor layer; a p-type second collector region provided between the second n base region and the second plane in the semiconductor layer, the p-type second collector region being electrically connected to the second collector electrode; a second trench gate insulating film provided between the second trench gate electrode and the second p base region, between the second trench gate electrode and the second emitter region, and between the second trench gate electrode and the second n base region, the second trench gate insulating film being in contact with the second p base region, the second emitter region, and the second n base region; a second dummy trench gate insulating film provided between the second dummy trench gate electrode and the second p base region and between the second dummy trench gate electrode and the second n base region, the second dummy trench gate insulating film being in contact with the second p base region and the second n base region; a gate pad electrode electrically connected to the first trench gate electrode, the first dummy trench gate electrode, the second trench gate electrode, and the second dummy trench gate electrode; a first electric resistor electrically connected between the gate pad electrode and the first trench gate electrode; a second electric resistor electrically connected between the gate pad electrode and the first dummy trench gate electrode; a third electric resistor electrically connected between the gate pad electrode and the second trench gate electrode; and a fourth electric resistor electrically connected between the gate pad electrode and the second dummy trench gate electrode. A CR time constant of the first trench gate electrode is less than a CR time constant of the first dummy trench gate electrode and a CR time constant of the second trench gate electrode is less than a CR time constant of the second dummy trench gate electrode.

The semiconductor device according to this embodiment differs from the semiconductor device according to the first embodiment in that it includes a first segment having the same configuration as the semiconductor device according to the first embodiment and a second segment having the same configuration as the semiconductor device according to the first embodiment. Hereinafter, the description of a portion of the same content as that in the first embodiment will not be repeated.

Figure 9:
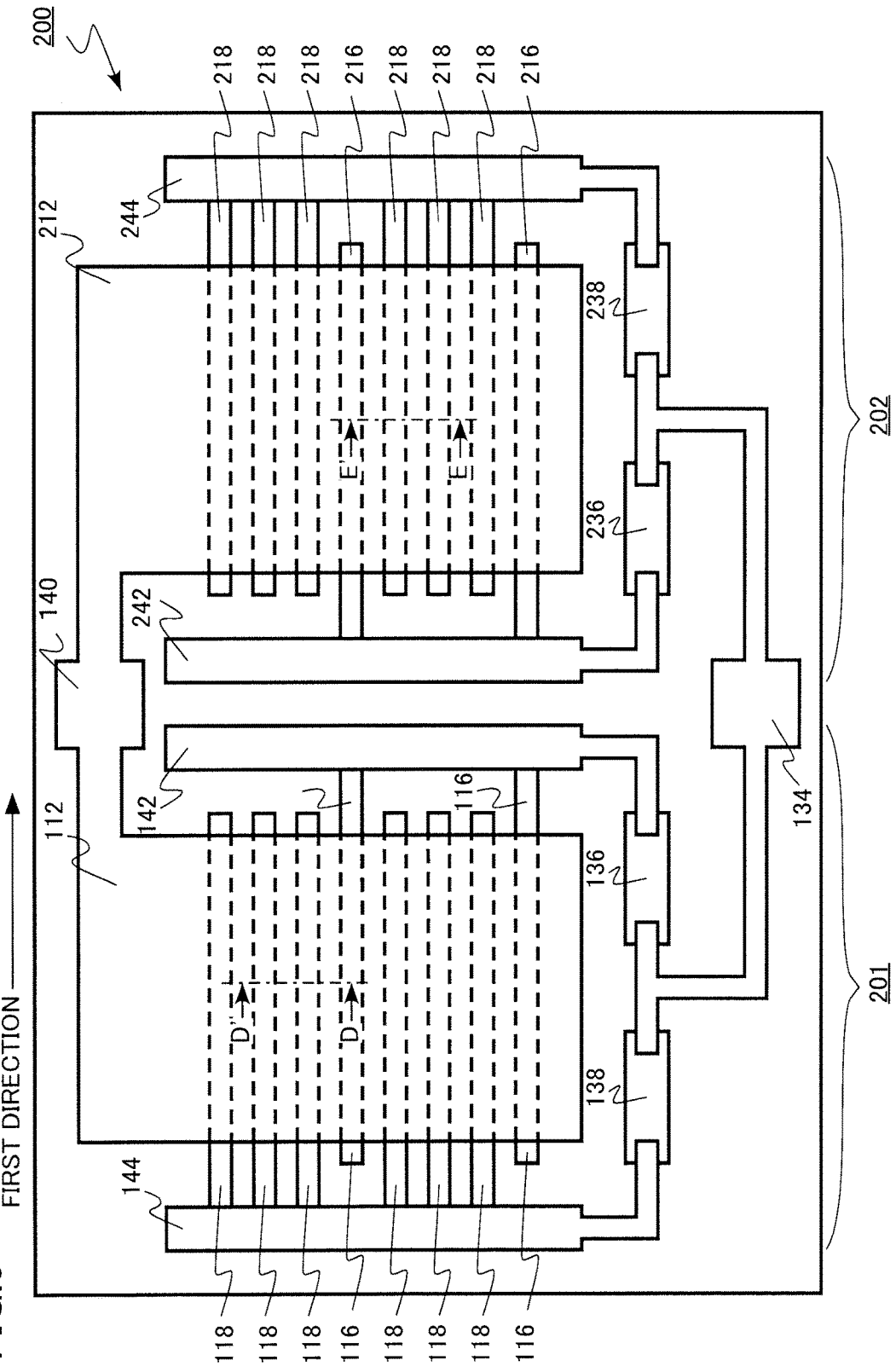
FIG. 9 is a plan view schematically illustrating a semiconductor device according to a second embodiment.
Figure 10B:
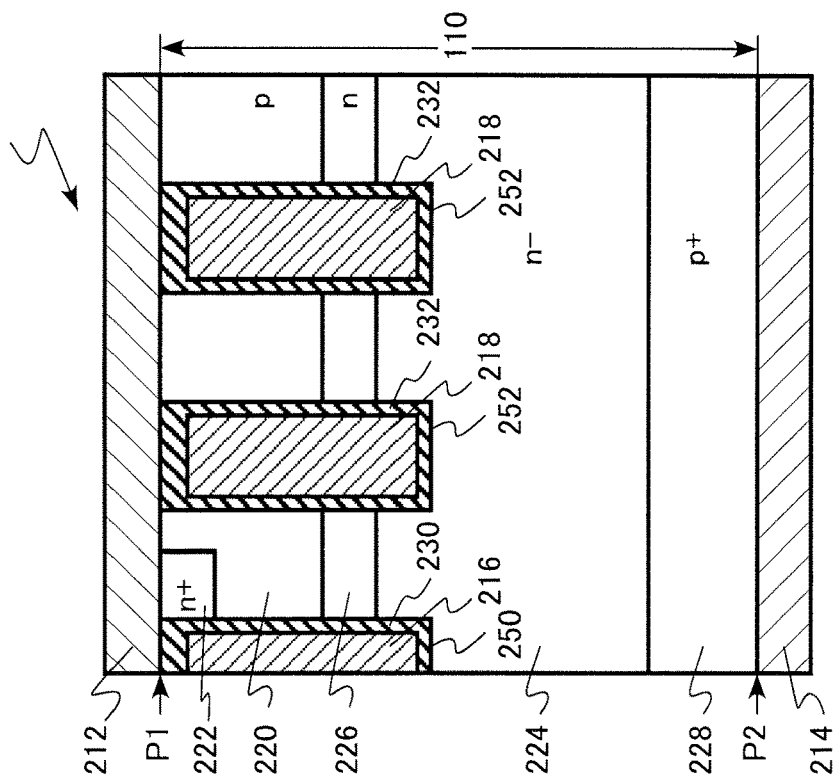
FIGS. 10A and 10B are cross-sectional views schematically illustrating the semiconductor device according to the second embodiment.
Figure 10A:
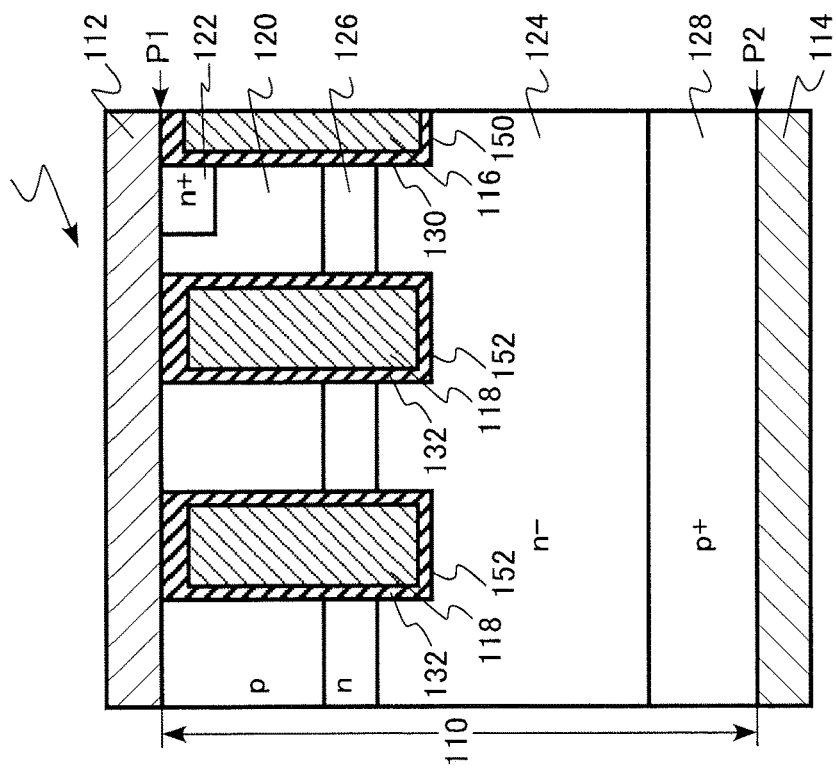
Figure 11:
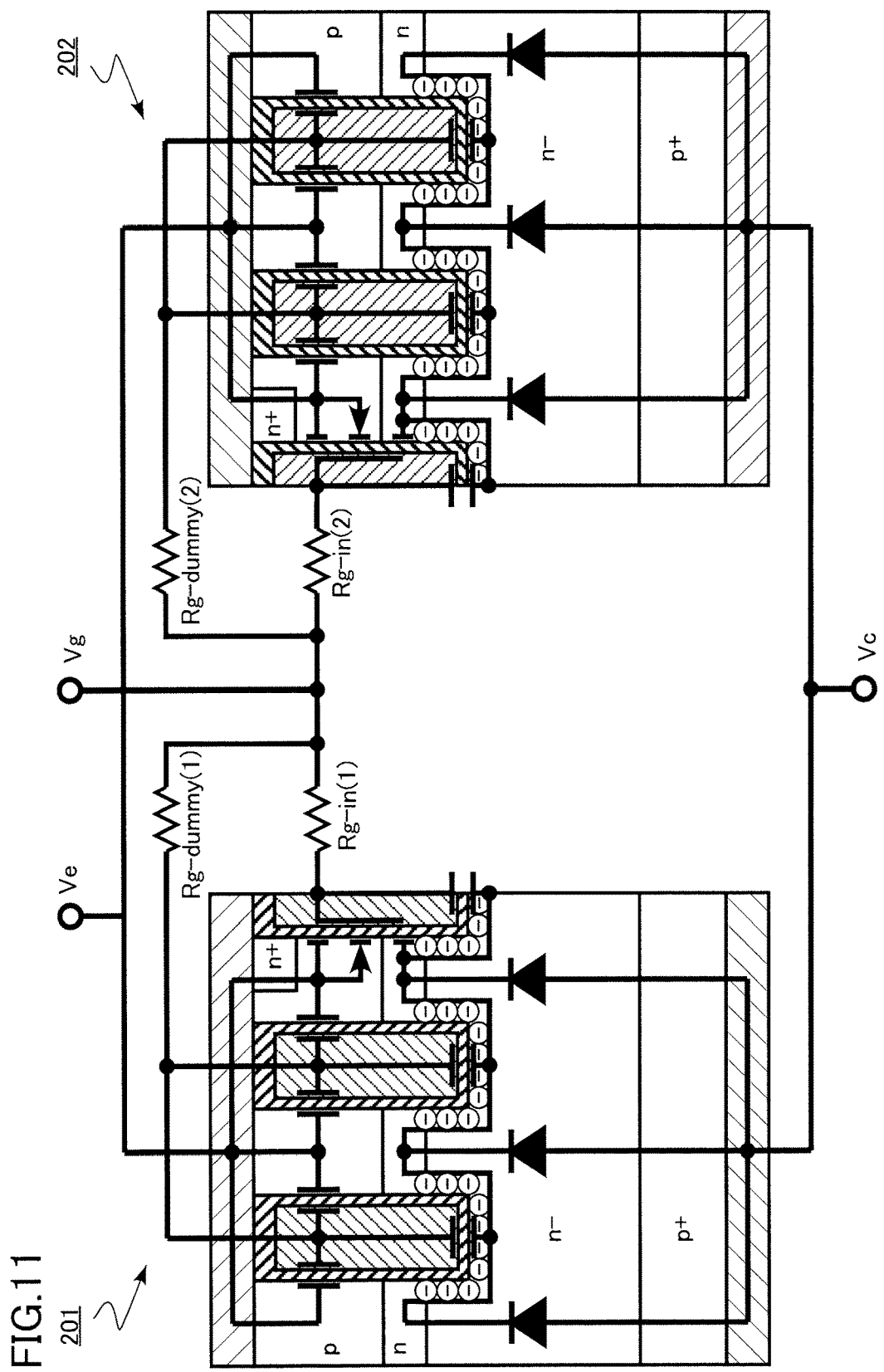
FIG. 11 is an equivalent circuit diagram illustrating the semiconductor device according to the second embodiment.

FIG. 9 is a plan view schematically illustrating the semiconductor device according to this embodiment. FIGS. 10A and 10B are cross-sectional views schematically illustrating the semiconductor device according to this embodiment. FIG. 10A is a cross-sectional view taken along the line DD' of FIG. 9. FIG. 10B is a cross-sectional view taken along the line EE' of FIG. 9. FIG. 11 is an equivalent circuit diagram illustrating the semiconductor device according to this embodiment. FIG. 11 is a diagram in which an equivalent circuit is overwritten on FIGS. 10A and 10B.

The semiconductor device according to this embodiment is a trench IGBT 200 in which a gate electrode is provided in a trench formed in a semiconductor layer. The trench IGBT 200 is a thinning out-type IGBT including a dummy trench gate electrode.

The trench IGBT 200 includes a first segment 201 and a second segment 202. Each of the first segment 201 and the second segment 202 has the same configuration as the trench IGBT 100 according to the first embodiment. However, an emitter pad electrode, a collector electrode, and a gate pad electrode are shared by the first segment 201 and the second segment 202.

The trench IGBT 200 according to this embodiment includes a semiconductor layer 110, a gate pad electrode 134, and an emitter pad electrode 140.

The first segment 201 includes a first emitter electrode 112, a first collector electrode 114, a first trench gate electrode 116, a first dummy trench gate electrode 118, a first p base region 120, a first emitter region 122, a first n base region 124, a first barrier region 126, a first collector region 128, a first trench gate insulating film 130, a first dummy trench gate insulating film 132, a first internal gate resistor 136 (first resistor), a first dummy gate resistor 138 (second resistor), a first gate electrode connection wire 142 (first connection wire), a first dummy gate electrode connection wire 144 (second connection wire), a first trench 150, and a first dummy trench 152.

The second segment 202 includes a second emitter electrode 212, a second collector electrode 214, a second trench gate electrode 216, a second dummy trench gate electrode 218, a second p base region 220, a second emitter region 222, a second n base region 224, a second barrier region 226, a second collector region 228, a second trench gate insulating film 230, a second dummy trench gate insulating film 232, a second internal gate resistor 236 (third resistor), a second dummy gate resistor 238 (fourth resistor), a second gate electrode connection wire 242 (third connection wire), a second dummy gate electrode connection wire 244 (fourth connection wire), a second trench 250, and a second dummy trench 252.

The first internal gate resistor 136 is provided on the semiconductor layer 110. The first internal gate resistor 136 is provided on the side of a first plane P1 of the semiconductor layer 110. The first internal gate resistor 136 is electrically connected between the gate pad electrode 134 and the first trench gate electrode 116. The first internal gate resistor 136 is made of, for example, polysilicon.

The first dummy gate resistor 138 is provided on the semiconductor layer 110. The first dummy gate resistor 138 is provided on the side of the first plane P1 of the semiconductor layer 110. The first dummy gate resistor 138 is electrically connected between the gate pad electrode 134 and the first dummy trench gate electrode 118. The first dummy gate resistor 138 is made of, for example, polysilicon.

The first gate electrode connection wire 142 is electrically connected between the first trench gate electrode 116 and the first internal gate resistor 136. The first gate electrode connection wire 142 is connected to an end portion of the first trench gate electrode 116. For example, the first gate electrode connection wire 142 is connected to the first trench gate electrode 116 by a contact portion (not illustrated).

The first dummy gate electrode connection wire 144 is electrically connected between the first dummy trench gate electrode 118 and the first dummy gate resistor 138. The first dummy gate electrode connection wire 144 is connected to an end portion of the first dummy trench gate electrode 118. For example, the first dummy gate electrode connection wire 144 is connected to the first dummy trench gate electrode 118 by a contact portion (not illustrated).

The first trench gate electrode 116 and the first dummy trench gate electrode 118 are located between the first gate electrode connection wire 142 and the first dummy gate electrode connection wire 144. In other words, the first gate electrode connection wire 142 is located at one end portion of each of the first trench gate electrode 116 and the first dummy trench gate electrode 118 and the first dummy gate electrode connection wire 144 is located at the other end portion of each of the first trench gate electrode 116 and the first dummy trench gate electrode 118.

A CR time constant of the first trench gate electrode 116 is less than a CR time constant of the first dummy trench gate electrode 118. The CR time constant of the first trench gate electrode 116 is mainly defined by the capacitance between the first trench gate electrode 116 and the semiconductor layer 110, a resistance value of the first trench gate electrode 116, and a resistance value of the first internal gate resistor 136. The CR time constant of the first dummy trench gate electrode 118 is mainly defined by the capacitance between the first dummy trench gate electrode 118 and the semiconductor layer 110, a resistance value of the first dummy trench gate electrode 118, and a resistance value of the first dummy gate resistor 138.

The second internal gate resistor 236 is provided on the semiconductor layer 110. The second internal gate resistor 236 is provided on the side of the first plane P1 of the semiconductor layer 110. The second internal gate resistor 236 is electrically connected between the gate pad electrode 134 and the second trench gate electrode 216. The second internal gate resistor 236 is made of, for example, polysilicon.

The second dummy gate resistor 238 is provided on the semiconductor layer 110. The second dummy gate resistor 238 is provided on the side of the first plane P1 of the semiconductor layer 110. The second dummy gate resistor 238 is electrically connected between the gate pad electrode 134 and the second dummy trench gate electrode 218. The second dummy gate resistor 238 is made of, for example, polysilicon.

The second gate electrode connection wire 242 is electrically connected between the second trench gate electrode 216 and the second internal gate resistor 236. The second gate electrode connection wire 242 is connected to an end portion of the second trench gate electrode 216. For example, the second gate electrode connection wire 242 is connected to the second trench gate electrode 216 by a contact portion (not illustrated).

The second dummy gate electrode connection wire 244 is electrically connected between the second dummy trench gate electrode 218 and the second dummy gate resistor 238. The second dummy gate electrode connection wire 244 is connected to an end portion of the second dummy trench gate electrode 218. For example, the second dummy gate electrode connection wire 244 is connected to the second dummy trench gate electrode 218 by a contact portion (not illustrated).

The second trench gate electrode 216 and the second dummy trench gate electrode 218 are located between the second gate electrode connection wire 242 and the second dummy gate electrode connection wire 244. In other words, the second gate electrode connection wire 242 is located at one end portion of each of the second trench gate electrode 216 and the second dummy trench gate electrode 218 and the second dummy gate electrode connection wire 244 is located at the other end portion of each of the second trench gate electrode 216 and the second dummy trench gate electrode 218.

A CR time constant of the second trench gate electrode 216 is less than a CR time constant of the second dummy trench gate electrode 218. The CR time constant of the second trench gate electrode 216 is mainly defined by the capacitance between the second trench gate electrode 216 and the semiconductor layer 110, a resistance value of the second trench gate electrode 216, and a resistance value of the second internal gate resistor 236. The CR time constant of the second dummy trench gate electrode 218 is mainly defined by the capacitance between the second dummy trench gate electrode 218 and the semiconductor layer 110, a resistance value of the second dummy trench gate electrode 218, and a resistance value of the second dummy gate resistor 238.

As illustrated in FIG. 11, in the trench IGBT 200 according to this embodiment, a first internal gate resistor (Rg-in(1)) and a first dummy gate resistor (Rg-dummy(1)) are connected in parallel to each other. For example, the first internal gate resistor (Rg-in(1)) and the first dummy gate resistor (Rg-dummy(1)) are connected to a gate driver through an external gate resistor outside the trench IGBT 200. The gate driver applies a gate voltage (Vg) to the first trench gate electrode 116 and the first dummy trench gate electrode 118.

The first internal gate resistor (Rg-in(1)) corresponds to the first internal gate resistor 136 illustrated in FIG. 9. The first dummy gate resistor (Rg-dummy(1)) corresponds to the first dummy gate resistor 138 illustrated in FIG. 9.

In the trench IGBT 200 according to the embodiment, a second internal gate resistor (Rg-in(2)) and a second dummy gate resistor (Rg-dummy(2)) are connected in parallel to each other. For example, the second internal gate resistor (Rg-in(2)) and the second dummy gate resistor (Rg-dummy(2)) are connected to the gate driver through an external gate resistor outside the trench IGBT 200. The gate driver applies the gate voltage (Vg) to the second trench gate electrode 216 and the second dummy trench gate electrode 218.

The second internal gate resistor (Rg-in(2)) corresponds to the second internal gate resistor 236 illustrated in FIG. 9. The second dummy gate resistor (Rg-dummy(2)) corresponds to the second dummy gate resistor 238 illustrated in FIG. 9.

In the trench IGBT 200 according to this embodiment, each of the first segment 201 and the second segment 202 includes the internal gate resistor and the dummy gate resistor. The first internal gate resistor 136 and the second internal gate resistor 236 are provided between the first trench gate electrode 116 of the first segment 201 and the second trench gate electrode 216 of the second segment 202. In addition, the first dummy gate resistor 138 and the second dummy gate resistor 238 are provided between the first dummy trench gate electrode 118 of the first segment 201 and the second dummy trench gate electrode 218 of the second segment 202.

Therefore, for example, even when the oscillation of the gate voltage occurs in one of the segments, the propagation of the oscillation to the other segment is prevented. As a result, it is possible to reduce the malfunction of the IGBT caused by the oscillation of the gate voltage.

As described above, according to the trench IGBT 200 of this embodiment, similarly to the trench IGBT 100 according to the first embodiment, it is possible to achieve an IGBT with low on-resistance and a high switching speed. In addition, it is possible to achieve an IGBT that can prevent the oscillation of a gate voltage or gate voltage overshoot/undershoot. Further, it is possible to reduce the area of a chip or to simplify a manufacturing process. Furthermore, it is possible to reduce the malfunction of the IGBT caused by the oscillation of the gate voltage.

Third Embodiment

A semiconductor device according to this embodiment differs from the semiconductor device according to the first embodiment in that it further includes a third electric resistor electrically connected between the second electric resistor and the dummy trench gate electrode, a fourth electric resistor electrically connected between the third electric resistor and the dummy trench gate electrode, a second gate electrode pad electrically connected between the second electric resistor and the third electric resistor, and a third gate electrode pad electrically connected between the third electric resistor and the dummy trench gate electrode. Hereinafter, the description of a portion of the same content as that in the first embodiment will not be repeated.

Figure 12:
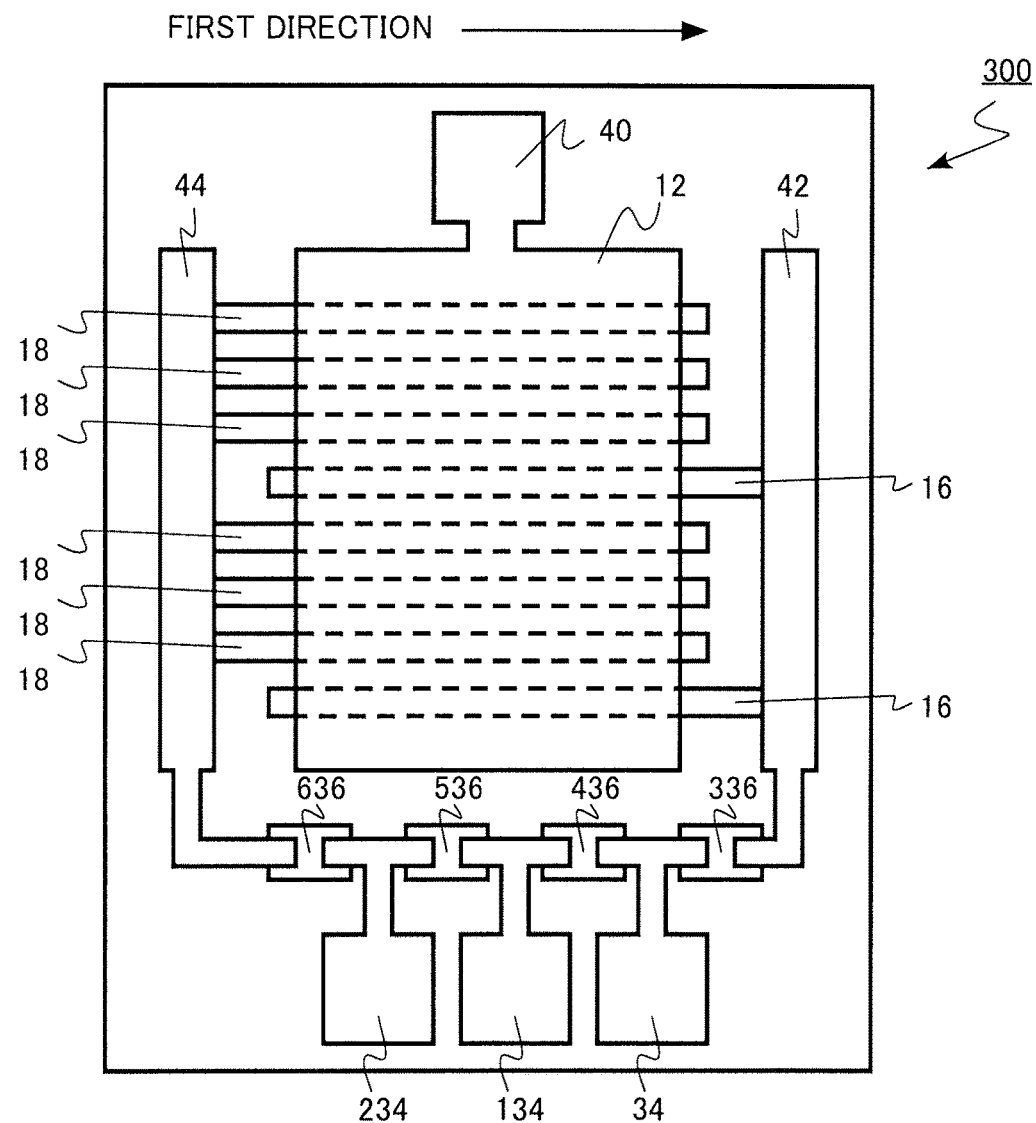
FIG. 12 is a plan view schematically illustrating a semiconductor device according to a third embodiment.

FIG. 12 is a plan view schematically illustrating the semiconductor device according to this embodiment.

The semiconductor device according to this embodiment is a trench IGBT 300 in which a gate electrode is provided in a trench formed in a semiconductor layer. The trench IGBT 300 is a thinning out-type IGBT including a dummy trench gate electrode.

The trench IGBT 300 according to this embodiment includes an emitter electrode 12, a trench gate electrode 16, a dummy trench gate electrode 18, a gate pad electrode 34 (first gate pad electrode), a gate pad electrode 134 (second gate pad electrode), a gate pad electrode 234 (third gate pad electrode), a first internal gate resistor 336 (first electric resistor), a second internal gate resistor 436 (second electric resistor), a third internal gate resistor 536 (third electric resistor), a fourth internal gate resistor 636 (fourth electric resistor), an emitter pad electrode 40, a gate electrode connection wire 42 (first connection wire), and a dummy gate electrode connection wire 44 (second connection wire).

The first internal gate resistor 336 is electrically connected between the gate pad electrode 34 and the trench gate electrode 16. The second internal gate resistor 436 (second electric resistor) is electrically connected between the gate pad electrode 34 and the dummy trench gate electrode 18. The third internal gate resistor 536 (third electric resistor) is electrically connected between the second internal gate resistor 436 (second electric resistor) and the dummy trench gate electrode 18. The fourth internal gate resistor 636 (fourth electric resistor) is electrically connected between the third internal gate resistor 536 (third electric resistor) and the dummy trench gate electrode 18.

The gate pad electrode 134 is electrically connected between the second internal gate resistor 436 (second electric resistor) and the third internal gate resistor 536. The gate pad electrode 234 is electrically connected between the third internal gate resistor 536 and the fourth internal gate resistor 636.

In the trench IGBT 300 according to this embodiment, a desired gate pad electrode is selected from three gate pad electrodes 34, 134, and 234 and a gate voltage is applied to change the ratio of the resistance value of an internal gate resistor (Rg-in) connected to the trench gate electrode 16 to the resistance value of a dummy gate resistor (Rg-dummy) connected to the dummy trench gate electrode 18. In other words, it is possible to change the ratio of a CR time constant of the trench gate electrode 16 to a CR time constant of the dummy trench gate electrode 18. Therefore, for example, after a device is manufactured, it is possible to adjust a switching speed corresponding to the application of the IGBT.

As described above, according to the trench IGBT 300 of this embodiment, similarly to the trench IGBT 100 according to the first embodiment, it is possible to achieve an IGBT with low on-resistance and a high switching speed. In addition, it is possible to achieve an IGBT that can prevent the oscillation of a gate voltage or gate voltage overshoot/undershoot. Further, it is possible to reduce the area of a chip or to simplify a manufacturing process. Furthermore, it is possible to adjust a switching speed after a device is manufactured.

Fourth Embodiment

A semiconductor device according to this embodiment includes a semiconductor layer having a first plane and a second plane opposite to the first plane; an emitter electrode, at least a portion of the emitter electrode being in contact with the first plane; a collector electrode, at least a portion of the collector electrode being in contact with the second plane; an upper trench gate electrode provided in the semiconductor layer, the upper trench gate electrode extending in a first direction substantially parallel to the first plane; a lower trench gate electrode provided between the upper trench gate electrode and the second plane in the semiconductor layer, the lower trench gate electrode extending in the first direction, the lower trench gate electrode being electrically separated from the upper trench gate electrode; an upper dummy trench gate electrode provided in the semiconductor layer, the upper dummy trench gate electrode extending in the first direction; a lower dummy trench gate electrode provided between the upper dummy trench gate electrode and the second plane in the semiconductor layer, the lower dummy trench gate electrode extending in the first direction, the lower dummy trench gate electrode being electrically separated from the upper dummy trench gate electrode; a p base region provided in the semiconductor layer; an n-type emitter region provided between the p base region and the first plane in the semiconductor layer, the n-type emitter region being electrically connected to the emitter electrode; an n base region provided between the p base region and the second plane in the semiconductor layer; a p-type collector region provided between the n base region and the second plane in the semiconductor layer, the p-type collector region being electrically connected to the collector electrode; a trench gate insulating film provided between the upper trench gate electrode and the p base region, between the upper trench gate electrode and the emitter region, and between the lower trench gate electrode and the n base region, the trench gate insulating film being in contact with the p base region, the emitter region, and the n base region; a dummy trench gate insulating film provided between the upper dummy trench gate electrode and the p base region and between the lower dummy trench gate electrode and the n base region, the dummy trench gate insulating film being in contact with the p base region and the n base region; a first gate pad electrode electrically connected to the upper trench gate electrode, the lower trench gate electrode, and the lower dummy trench gate electrode; a first electric resistor electrically connected between the first gate pad electrode and the upper trench gate electrode; and a second electric resistor electrically connected between the first gate pad electrode and the lower trench gate electrode and between the first gate pad electrode and the lower dummy trench gate electrode. A CR time constant of the upper trench gate electrode is less than a CR time constant of the lower dummy trench gate electrode.

Figure 13:
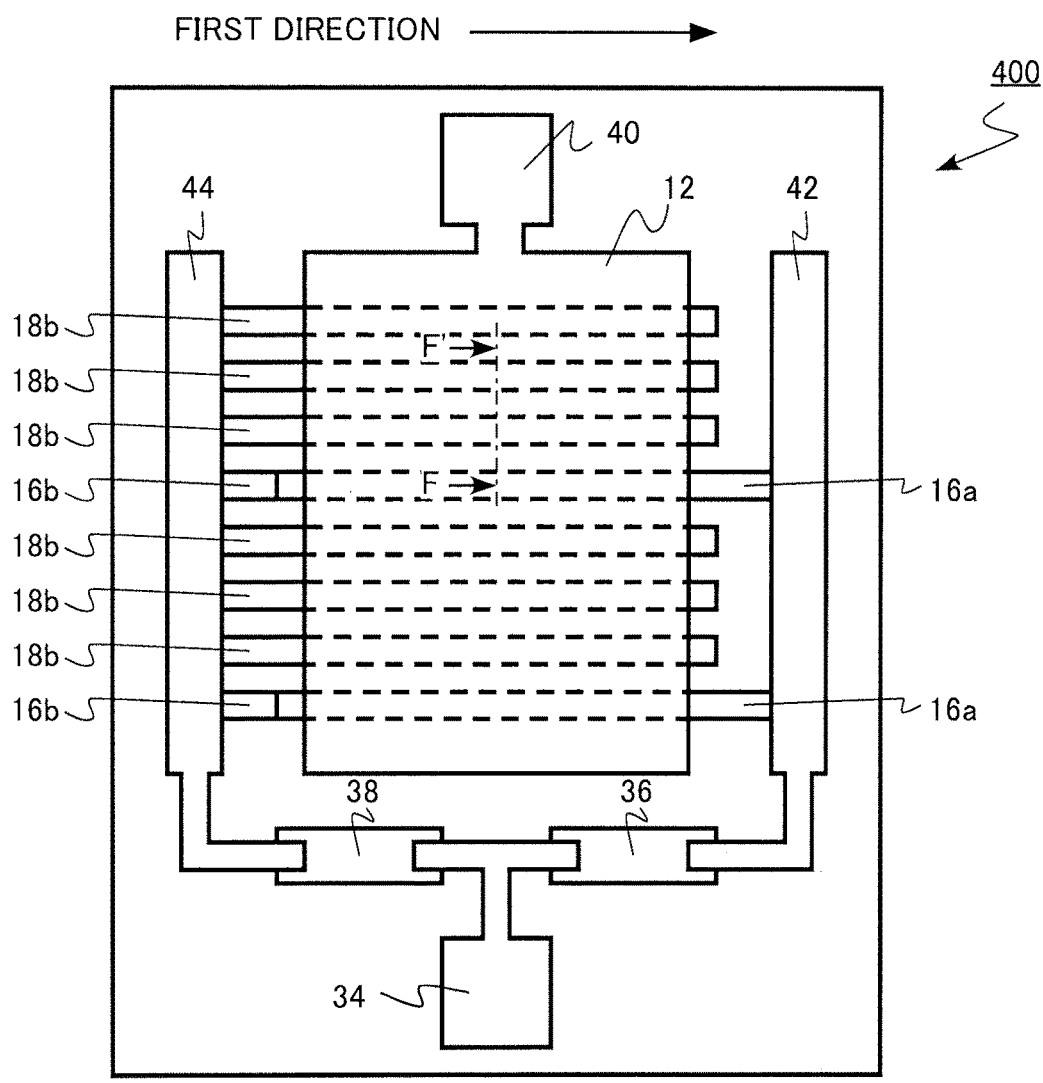
FIG. 13 is a plan view schematically illustrating a semiconductor device according to a fourth embodiment.
Figure 14B:
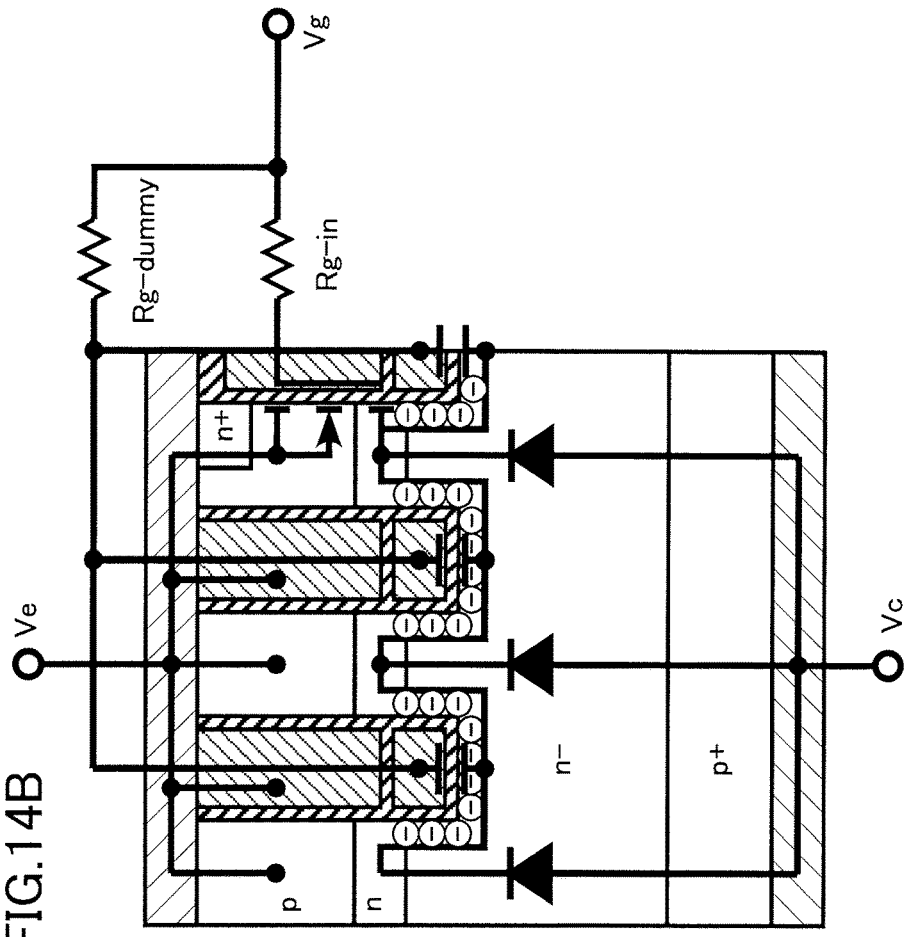
FIGS. 14A and 14B are cross-sectional views schematically illustrating the semiconductor device according to the fourth embodiment.
Figure 14A:
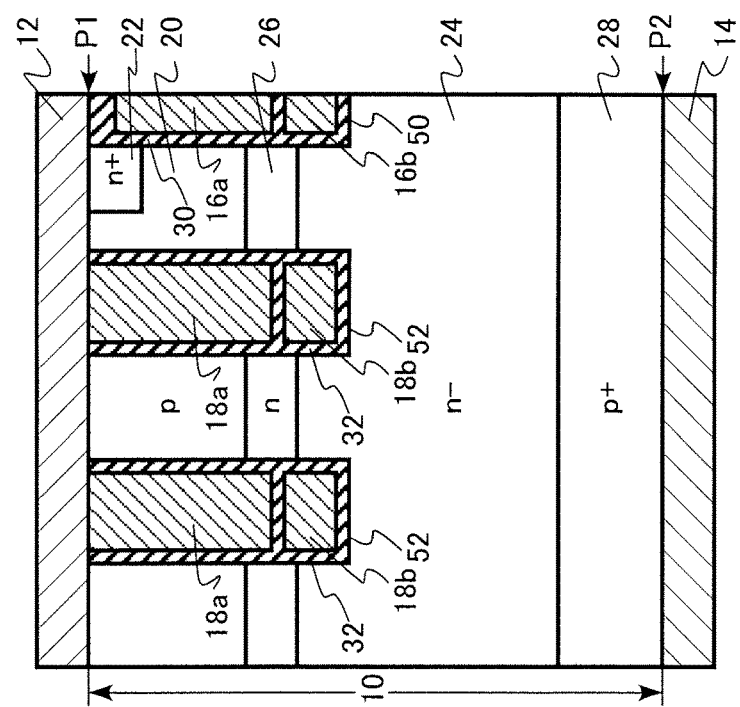

FIG. 13 is a plan view schematically illustrating the semiconductor device according to this embodiment. FIGS. 14A and 14B are cross-sectional views schematically illustrating the semiconductor device according to this embodiment. FIG. 14A is a cross-sectional view taken along the line FF' of FIG. 13. FIG. 14B is a diagram in which an equivalent circuit is overwritten on FIG. 14A.

The semiconductor device according to this embodiment is a trench IGBT 400 in which a gate electrode is provided in a trench formed in a semiconductor layer. The trench IGBT 400 is a thinning out-type IGBT including a dummy trench gate electrode. The trench IGBT 400 is an IGBT with a double gate electrode structure in which gate electrodes are provided in one trench so as to be separated from each other in the vertical direction.

The trench IGBT 400 according to this embodiment includes a semiconductor layer 10, an emitter electrode 12, a collector electrode 14, an upper trench gate electrode 16a, a lower trench gate electrode 16b, an upper dummy trench gate electrode 18a, a lower dummy trench gate electrode 18b, a p base region 20, an emitter region 22, an n base region 24, a barrier region 26 (n-type semiconductor region), a collector region 28, a trench gate insulating film 30, a dummy trench gate insulating film 32, a gate pad electrode 34 (first gate pad electrode), an internal gate resistor 36 (first electric resistor), a dummy gate resistor 38 (second electric resistor), an emitter pad electrode 40, a gate electrode connection wire 42 (first connection wire), a dummy gate electrode connection wire 44 (second connection wire), a trench 50, and a dummy trench 52.

The semiconductor layer 10 has a first plane P1 and a second plane P2 that is opposite to the first plane P1. The semiconductor layer 10 is made of, for example, single-crystal silicon. The thickness of the semiconductor layer 10 is, for example, equal to or greater than 50 μm and equal to or less than 700 μm.

At least a portion of the emitter electrode 12 comes into contact with the first plane P1 of the semiconductor layer 10. For example, at least a portion of the emitter electrode 12 comes into contact with the upper dummy trench gate electrode 18a. The emitter electrode 12 is made of, for example, metal. An emitter voltage (Ve) is applied to the emitter electrode 12. The emitter voltage is, for example, 0 V.

At least a portion of the collector electrode 14 comes into contact with the second plane P2 of the semiconductor layer 10. The collector electrode 14 is made of, for example, metal. A collector voltage (Vc) is applied to the collector electrode 14. The collector voltage is, for example, equal to or greater than 200 V and equal to or less than 6500 V.

A plurality of upper trench gate electrodes 16a and a plurality of lower trench gate electrodes 16b are provided in the semiconductor layer 10. The upper trench gate electrode 16a and the lower trench gate electrode 16b are provided in the trench 50 formed in the semiconductor layer 10. The upper trench gate electrode 16a and the lower trench gate electrode 16b extend in a first direction that is substantially parallel to the first plane P1. The lower trench gate electrode 16b is provided between the upper trench gate electrode 16a and the second plane P2. The upper trench gate electrode 16a and the lower trench gate electrode 16b are electrically separated from each other. An insulating film is provided between the upper trench gate electrode 16a and the lower trench gate electrode 16b. The upper trench gate electrode 16a and the lower trench gate electrode 16b are made of, for example, polysilicon including n-type impurities or p-type impurities.

A plurality of upper dummy trench gate electrodes 18a and a plurality of lower dummy trench gate electrodes 18b are provided in the semiconductor layer 10. The upper dummy trench gate electrode 18a and the lower dummy trench gate electrode 18b are provided in the dummy trench 52 formed in the semiconductor layer 10. The upper dummy trench gate electrode 18a and the lower dummy trench gate electrode 18b extend in the first direction that is substantially parallel to the first plane P1. The lower dummy trench gate electrode 18b is provided between the upper dummy trench gate electrode 18a and the second plane P2. The upper dummy trench gate electrode 18a and the lower dummy trench gate electrode 18b are electrically separated from each other. An insulating film is provided between the upper dummy trench gate electrode 18a and the lower dummy trench gate electrode 18b. The upper dummy trench gate electrode 18a is provided between two upper trench gate electrodes 16a so as to be parallel to the upper trench gate electrode 16a. The lower dummy trench gate electrode 18b are provided between two lower trench gate electrodes 16b so as to be parallel to the lower trench gate electrode 16b. The upper dummy trench gate electrode 18a and the lower dummy trench gate electrode 18b are made of, for example, polysilicon including n-type impurities or p-type impurities.

For example, the upper dummy trench gate electrode 18a is electrically connected to the emitter electrode 12. For example, the upper dummy trench gate electrode 18a comes into contact with the emitter electrode 12. The upper dummy trench gate electrode 18a may be, for example, a floating gate electrode.

The p base region 20 is provided in the semiconductor layer 10. The p base region 20 is a p-type semiconductor region. A portion of the p base region 20 which comes into contact with the trench gate insulating film 30 functions as a channel region of the trench IGBT 400.

The emitter region 22 is provided in the semiconductor layer 10. The emitter region 22 is provided between the p base region 20 and the first plane P1 and comes into contact with the trench gate insulating film 30. The emitter region 22 is an n-type semiconductor region. The emitter region 22 is not provided between two dummy trenches 52. The emitter region 22 is electrically connected to the emitter electrode 12.

The n base region 24 is provided in the semiconductor layer 10. The n base region 24 is provided between the p base region 20 and the second plane. The n base region 24 is an n-type semiconductor region.

The barrier region 26 is provided in the semiconductor layer 10. The barrier region 26 is provided between the p base region 20 and the n base region 24. The barrier region 26 is an n-type semiconductor region. The n-type impurity concentration of the barrier region 26 is higher than the n-type impurity concentration of the n base region 24. The n-type impurity concentration of the barrier region 26 is lower than the n-type impurity concentration of the emitter region 22. The barrier region 26 has a function of reducing the on-resistance of the trench IGBT 400.

A distance from the first plane P1 from the interface between the n base region 24 and the barrier region 26 is greater than a distance from the first plane P1 to the lower trench gate electrode 16b. In addition, the distance from the first plane P1 the interface between the n base region 24 and the barrier region 26 is greater than a distance from the first plane P1 to the lower dummy trench gate electrode 18b.

The collector region 28 is provided in the semiconductor layer 10. The collector region 28 is provided between the n base region 24 and the second plane P2. The collector region 28 is a p-type semiconductor region. The p-type impurity concentration of the collector region 28 is higher than the p-type impurity concentration of the p base region 20. The collector region 28 is electrically connected to the collector electrode 14.

A buffer region having a higher n-type impurity concentration than the n base region 24 may be provided between the n base region 24 and the collector region 28. The provision of the buffer region makes it possible to prevent the spreading of a depletion layer when the trench IGBT 400 is turned off.

The trench gate insulating film 30 is provided between the upper trench gate electrode 16a and the p base region 20, between the upper trench gate electrode 16a and the emitter region 22, between the upper trench gate electrode 16a and the barrier region 26, and between the lower trench gate electrode 16b and the n base region 24. The trench gate insulating film 30 is provided in the trench 50. The trench gate insulating film 30 comes into contact with the p base region 20, the emitter region 22, the barrier region 26, and the n base region 24. The trench gate insulating film 30 is made of, for example, silicon oxide.

The dummy trench gate insulating film 32 is provided between the upper dummy trench gate electrode 18a and the p base region 20, between the upper dummy trench gate electrode 18a and the barrier region 26, and between the lower dummy trench gate electrode 18b and the n base region 24. The dummy trench gate insulating film 32 is provided in the dummy trench 52. The dummy trench gate insulating film 32 comes into contact with the p base region 20, the barrier region 26, and the n base region 24. The dummy trench gate insulating film 32 does not come into contact with the emitter region 22. The dummy trench gate insulating film 32 is made of, for example, silicon oxide.

The gate pad electrode 34 is provided on the semiconductor layer 10. The gate pad electrode 34 is provided on the side of the first plane P1 of the semiconductor layer 10. The gate pad electrode 34 is electrically connected to the upper trench gate electrode 16a, the lower trench gate electrode 16b, and the lower dummy trench gate electrode 18b. The gate pad electrode 34 is made of, for example, metal.

The internal gate resistor 36 is provided on the semiconductor layer 10. The internal gate resistor 36 is provided on the side of the first plane P1 of the semiconductor layer 10. The internal gate resistor 36 is electrically connected between the gate pad electrode 34 and the upper trench gate electrode 16a.

The internal gate resistor 36 is made of, for example, a semiconductor. The internal gate resistor 36 is made of, for example, polysilicon including conductive impurities. The internal gate resistor 36 is made of, for example, a material having a higher resistivity than the gate electrode connection wire 42.

The dummy gate resistor 38 is provided on the semiconductor layer 10. The dummy gate resistor 38 is provided on the side of the first plane P1 of the semiconductor layer 10. The dummy gate resistor 38 is electrically connected between the gate pad electrode 34 and the lower trench gate electrode 16b and between the gate pad electrode 34 and the lower dummy trench gate electrode 18b.

The dummy gate resistor 38 is made of, for example, a semiconductor. The dummy gate resistor 38 is made of, for example, polysilicon including conductive impurities. The dummy gate resistor 38 is made of, for example, a material having a higher resistivity than the dummy gate electrode connection wire 44.

The gate electrode connection wire 42 is electrically connected between the upper trench gate electrode 16a and the internal gate resistor 36. The gate electrode connection wire 42 is connected to an end portion of the upper trench gate electrode 16a. For example, the gate electrode connection wire 42 is connected to the upper trench gate electrode 16a by a contact portion (not illustrated). The gate electrode connection wire 42 is made of, for example, metal.

The dummy gate electrode connection wire 44 is electrically connected between the lower trench gate electrode 16b and the dummy gate resistor 38 and between the lower dummy trench gate electrode 18b and the dummy gate resistor 38. The dummy gate electrode connection wire 44 is connected to an end portion of each of the lower trench gate electrode 16b and the lower dummy trench gate electrode 18b. For example, the dummy gate electrode connection wire 44 is connected to the lower trench gate electrode 16b and the lower dummy trench gate electrode 18b by a contact portion (not illustrated). The dummy gate electrode connection wire 44 is made of, for example, metal.

The upper trench gate electrode 16a and the lower dummy trench gate electrode 18b are located between the gate electrode connection wire 42 and the dummy gate electrode connection wire 44. In other words, the gate electrode connection wire 42 is located at one end portion of each of the upper trench gate electrode 16a and the lower dummy trench gate electrode 18b and the dummy gate electrode connection wire 44 is located at the other end portion of each of the upper trench gate electrode 16a and the lower dummy trench gate electrode 18b.

A CR time constant of the upper trench gate electrode 16a is less than a CR time constant of the lower dummy trench gate electrode 18b. The CR time constant of the upper trench gate electrode 16a is mainly defined by the capacitance between the upper trench gate electrode 16a and the semiconductor layer 10, a resistance value of the upper trench gate electrode 16a, and a resistance value of the internal gate resistor 36. The CR time constant of the lower dummy trench gate electrode 18b is mainly defined by the capacitance between the lower dummy trench gate electrode 18b and the semiconductor layer 10, a resistance value of the lower dummy trench gate electrode 18b, and a resistance value of the dummy gate resistor 38.

In addition, the CR time constant of the upper trench gate electrode 16a is less than the CR time constant of the lower trench gate electrode 16b.

The emitter pad electrode 40 is provided on the semiconductor layer 10. The emitter pad electrode 40 is provided on the side of the first plane P1 of the semiconductor layer 10. The emitter pad electrode 40 is electrically connected to the emitter electrode 12.

The trench IGBT 400 is a three-terminal device having three electrodes, that is, the emitter pad electrode 40, the collector electrode 14, and the gate pad electrode 34 as terminals.

As illustrated in FIG. 14B, in the trench IGBT 400 according to this embodiment, an internal gate resistor (Rg-in) and a dummy gate resistor (Rg-dummy) are connected in parallel to each other. For example, the internal gate resistor (Rg-in) and the dummy gate resistor (Rg-dummy) are connected to a gate driver through an external gate resistor outside the trench IGBT 400. The gate driver applies a gate voltage (Vg) to the upper trench gate electrode 16a, the lower trench gate electrode 16b, and the lower dummy trench gate electrode 18b.

The internal gate resistor (Rg-in) corresponds to the internal gate resistor 36 illustrated in FIG. 13. The dummy gate resistor (Rg-dummy) corresponds to the dummy gate resistor 38 illustrated in FIG. 13.

For example, the p base region 20 is electrically connected to the emitter electrode 12. For example, the p base region 20 is fixed to a ground potential. The p base region 20 interposed between the dummy trenches 52 may be, for example, a floating region.

Next, the function and effect of the trench IGBT 400 according to this embodiment will be described.

The trench IGBT 400 according to this embodiment has the double gate electrode structure in which the upper trench gate electrode 16a and the lower trench gate electrode 16b are provided in one trench 50.

For example, the resistance values of the internal gate resistor 36 and the dummy gate resistor 38 are adjusted such that the CR time constant of the upper trench gate electrode 16a is less than the CR time constant of the lower trench gate electrode 16b. Then, the upper trench gate electrode 16a can be charged and discharged earlier than the lower trench gate electrode 16b. Therefore, it is possible to improve the switching speed of the trench IGBT 400.

When the trench IGBT 400 is turned on, the lower trench gate electrode 16b is charged to the gate voltage (Vg) later than the upper trench gate electrode 16a. Therefore, an electron accumulation layer is formed in the n base region 24 in the vicinity of the bottom of the trench 50 and on-resistance is reduced.

Similarly to the trench IGBT 100 according to the first embodiment, for example, the resistance values of the internal gate resistor 36 and the dummy gate resistor 38 are adjusted such that the CR time constant of the upper trench gate electrode 16a is less than the CR time constant of the lower dummy trench gate electrode 18b. Then, the upper trench gate electrode 16a can be charged and discharged earlier than the lower dummy trench gate electrode 18b. Therefore, it is possible to improve the switching speed of the trench IGBT 400.

Similarly to the trench IGBT 100 according to the first embodiment, when the trench IGBT 400 is turned on, the lower dummy trench gate electrode 18b is charged to the gate voltage (Vg) later than the upper trench gate electrode 16a. Therefore, an electron accumulation layer is formed in the n base region 24 in the vicinity of the bottom of the dummy trench 52 and on-resistance is reduced.

In addition, the upper dummy trench gate electrode 18a is electrically separated from the lower dummy trench gate electrode 18b. Therefore, gate capacitance is less than that in the trench IGBT 100 according to the first embodiment by a value corresponding to the upper dummy trench gate electrode 18a. As a result, for example, it is possible to reduce the driving capability of the gate driver and to reduce the size of the gate driver.

Figure 15:
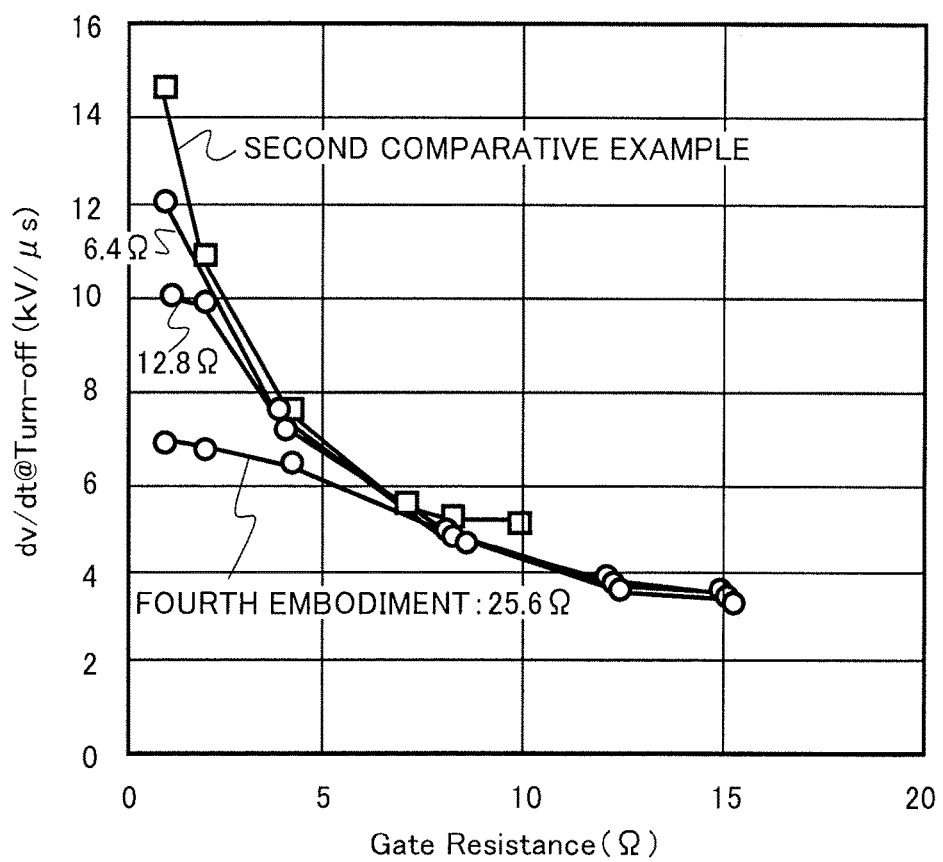
FIG. 15 is a diagram illustrating the function and effect of the semiconductor device according to the fourth embodiment.

FIG. 15 is a diagram illustrating the function and effect of the semiconductor device according to this embodiment. FIG. 15 is a diagram illustrating a relationship between gate resistance and the time rate of change in the collector-emitter voltage (Vce) (dV/dt) when the IGBT is turned off. The resistance value of the gate resistor is the resistance value of the external gate resistor that is provided outside the IGBT. The time rate of change in the collector-emitter voltage (Vce) (dV/dt) is an index indicating the switching speed when the IGBT is turned off.

FIG. 15 also illustrates the structure of the second comparative example described in the first embodiment for comparison. In this embodiment (fourth embodiment), the resistance value of the dummy gate resistor (Rg-dummy) is 6.4Ω, 12.8Ω, and 25.6Ω.

In this embodiment, all of the feedback capacitors between the collector and the gate are charged and discharged with a current (Ig-dummy) that flows through the dummy gate resistor (Rg-dummy). Therefore, the time rate of change (dV/dt) can be adjusted by the resistance value of the dummy gate resistor (Rg-dummy).

As can be seen from FIG. 15, the resistance value of the dummy gate resistor (Rg-dummy) is increased to obtain high linearity. Therefore, the resistance value of the dummy gate resistor (Rg-dummy) is increased to improve the controllability of the switching speed by the external gate resistor.

Fifth Embodiment

A semiconductor device according to this embodiment differs from the semiconductor device according to the first embodiment in that it further includes a zener diode having an anode which is electrically connected to the emitter electrode and a cathode which is connected between the second electric resistor and the dummy trench gate electrode. Hereinafter, the description of a portion of the same content as that in the first embodiment will not be repeated.

Figure 16:
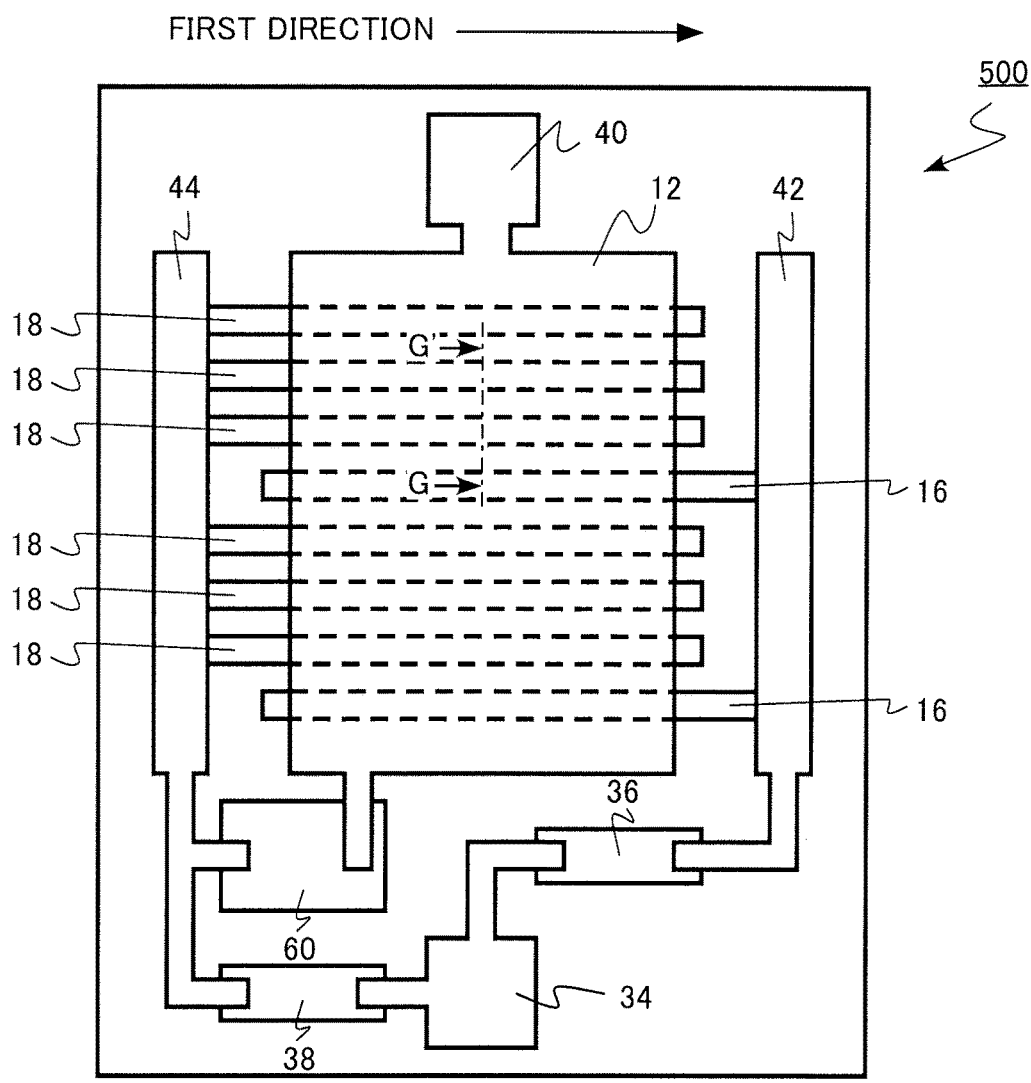
FIG. 16 is a plan view schematically illustrating a semiconductor device according to a fifth embodiment.
Figure 17A:
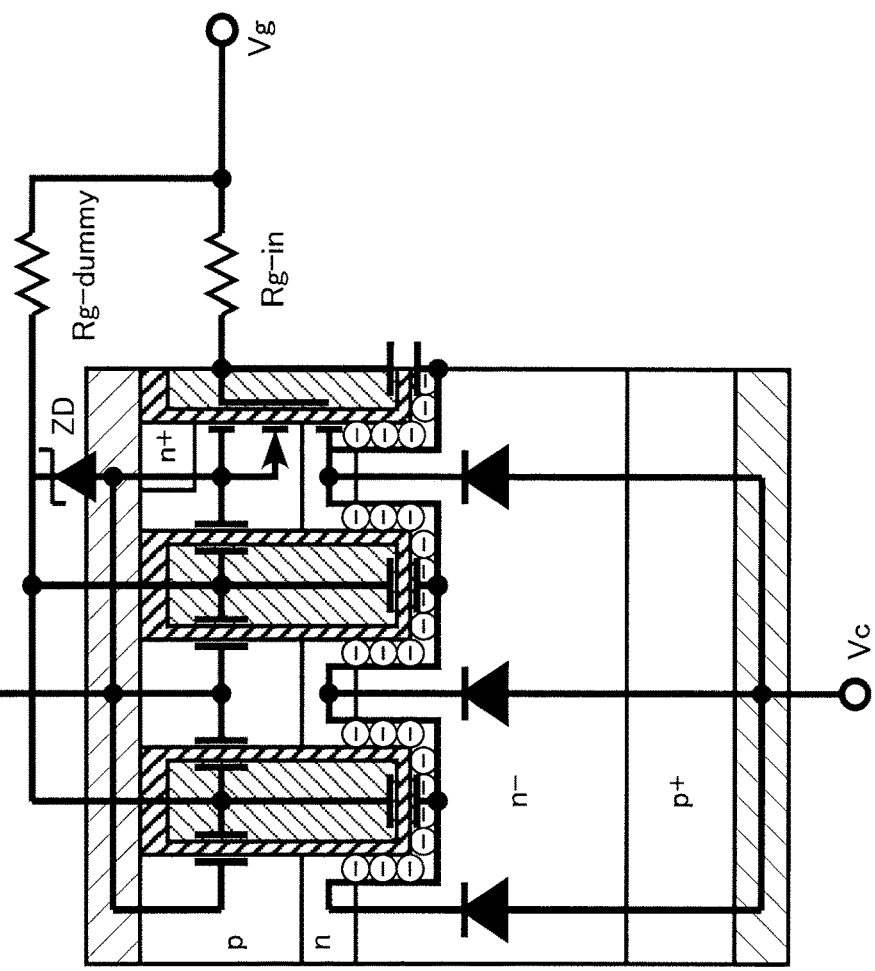
FIGS. 17A and 17B are cross-sectional views schematically illustrating the semiconductor device according to the fifth embodiment.
Figure 17B:
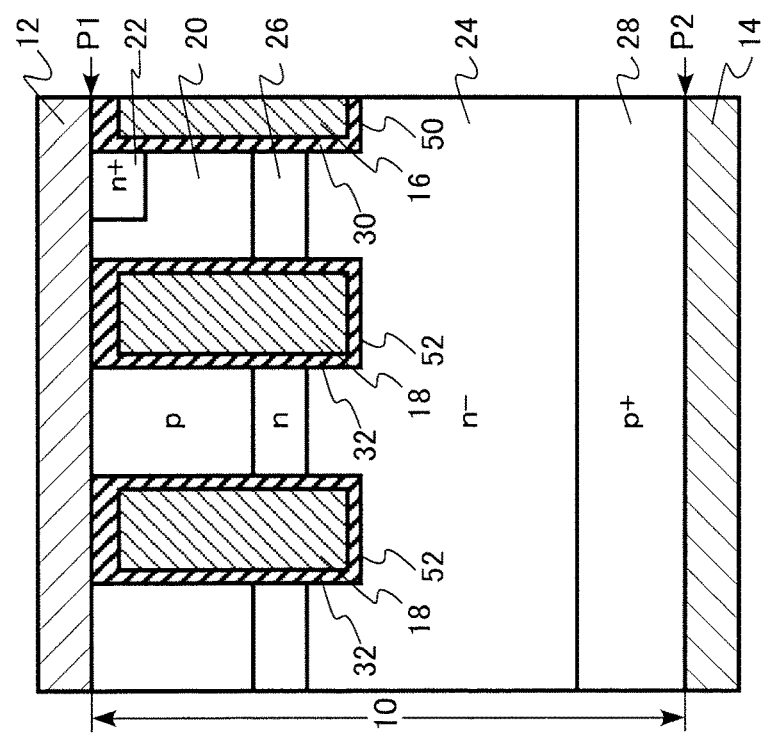

FIG. 16 is a plan view schematically illustrating the semiconductor device according to this embodiment. FIGS. 17A and 17B are cross-sectional views schematically illustrating the semiconductor device according to this embodiment. FIG. 17A is a cross-sectional view taken along the line GG' of FIG. 16. FIG. 17B is a diagram in which an equivalent circuit is overwritten on FIG. 17A.

The semiconductor device according to this embodiment is a trench IGET 500 in which a gate electrode is provided in a trench formed in a semiconductor layer. The trench IGBT 500 is a thinning out-type IGBT including a dummy trench gate electrode.

The trench IGBT 500 includes a zener diode 60 (ZD in FIG. 17B) having an anode and a cathode. The anode is electrically connected to the emitter electrode 12. The cathode is connected between the dummy gate resistor 38 (second electric resistor) and the dummy trench gate electrode 18. The zener diode 60 is made of, for example, polysilicon.

In this embodiment, the feedback capacitor between the collector and the gate is bypassed to the emitter electrode 12 by the zener diode 60. Therefore, in this configuration, the feedback capacitor can be charged and discharged with a smaller amount of gate current than that in a case in which the zener diode 60 is not provided. As a result, the switching speed is improved when the IGBT is turned off.

It is preferable to increase the resistance value of the dummy gate resistor (Rg-dummy) in order to turn on the zener diode 60 when the trench IGBT 500 is turned off. When the resistance value of the dummy gate resistor (Rg-dummy) is increased, the voltage of the dummy trench gate electrode 18 is pulled to a collector voltage and is higher than a zener voltage of the zener diode 60. Then, the zener diode 60 is turned on.

The zener voltage of the zener diode 60 is higher than a gate on voltage that is applied to the gate pad electrode 34 (first gate pad electrode) when the trench IGBT 500 is turned on. Since the zener voltage of the zener diode 60 is higher than the gate on voltage when the trench IGBT 500 is turned on, the zener diode 60 is turned on when the trench IGBT 500 is turned on and the malfunction of the trench IGBT 500 is prevented.

Figure 18:
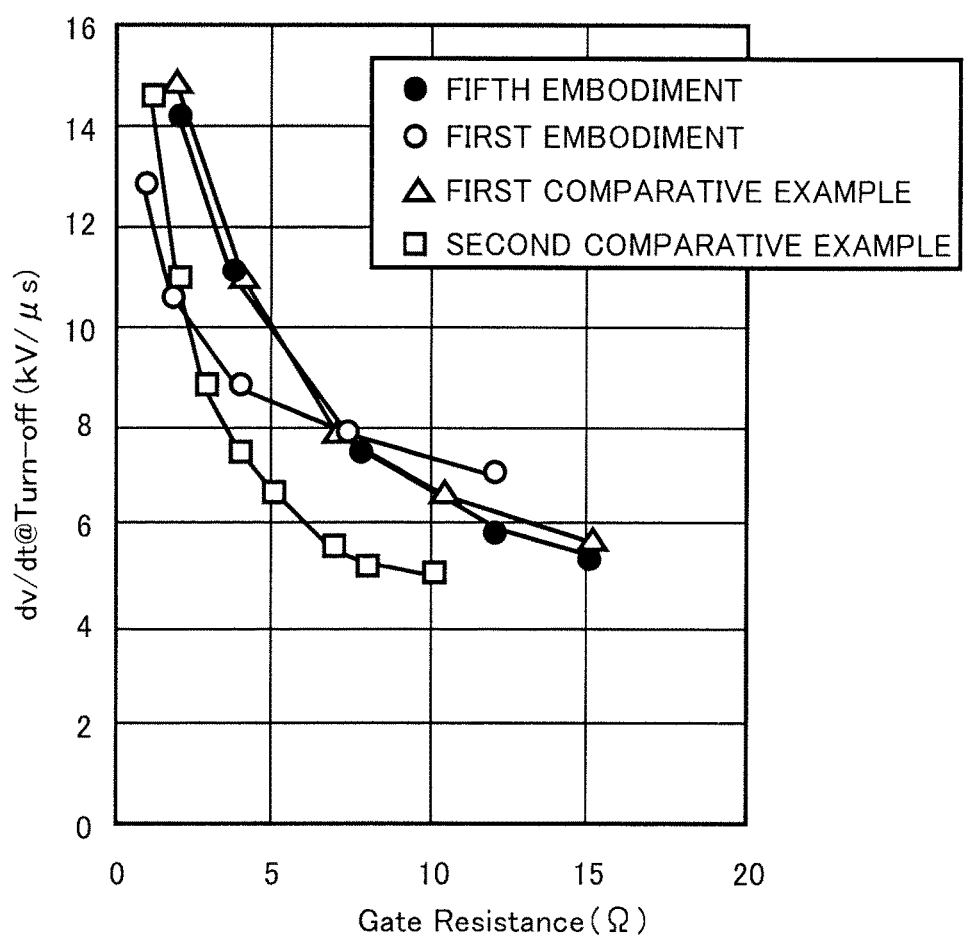
FIG. 18 is a diagram illustrating the function and effect of the semiconductor device according to the fifth embodiment.

FIG. 18 is a diagram illustrating the function and effect of the semiconductor device according to this embodiment. FIG. 18 is a diagram illustrating a relationship between gate resistance and the time rate of change in the collector-emitter voltage (Vce) (dV/dt) when the IGBT is turned off. The resistance value of the gate resistor is the resistance value of the external gate resistor that is provided outside the IGBT. The time rate of change in the collector-emitter voltage (Vce) (dV/dt) is an index indicating the switching speed when the IGBT is turned off.

FIG. 18 also illustrates the structure of the trench IGBT 100 according to the first embodiment and the trench IGBTs 800 and 900 according to the first and second comparative examples described in the first embodiment for comparison. In this embodiment, the time rate of change (dV/dt) is higher than that in the first embodiment and the switching speed when the IGBT is turned off is improved. In addition, the same switching speed as that in the first comparative example is obtained.

As described above, according to the trench IGBT 500 of this embodiment, it is possible to achieve an IGBT with low on-resistance and a high switching speed.

Sixth Embodiment

A semiconductor device according to this embodiment differs from the semiconductor device according to the fourth embodiment in that it further includes a zener diode having an anode which is electrically connected to the emitter electrode and a cathode which is connected between the second electric resistor and the lower dummy trench gate electrode and between the second electric resistor and the lower trench gate electrode. Hereinafter, the description of a portion of the same content as that in the fourth embodiment will not be repeated.

Figure 19:
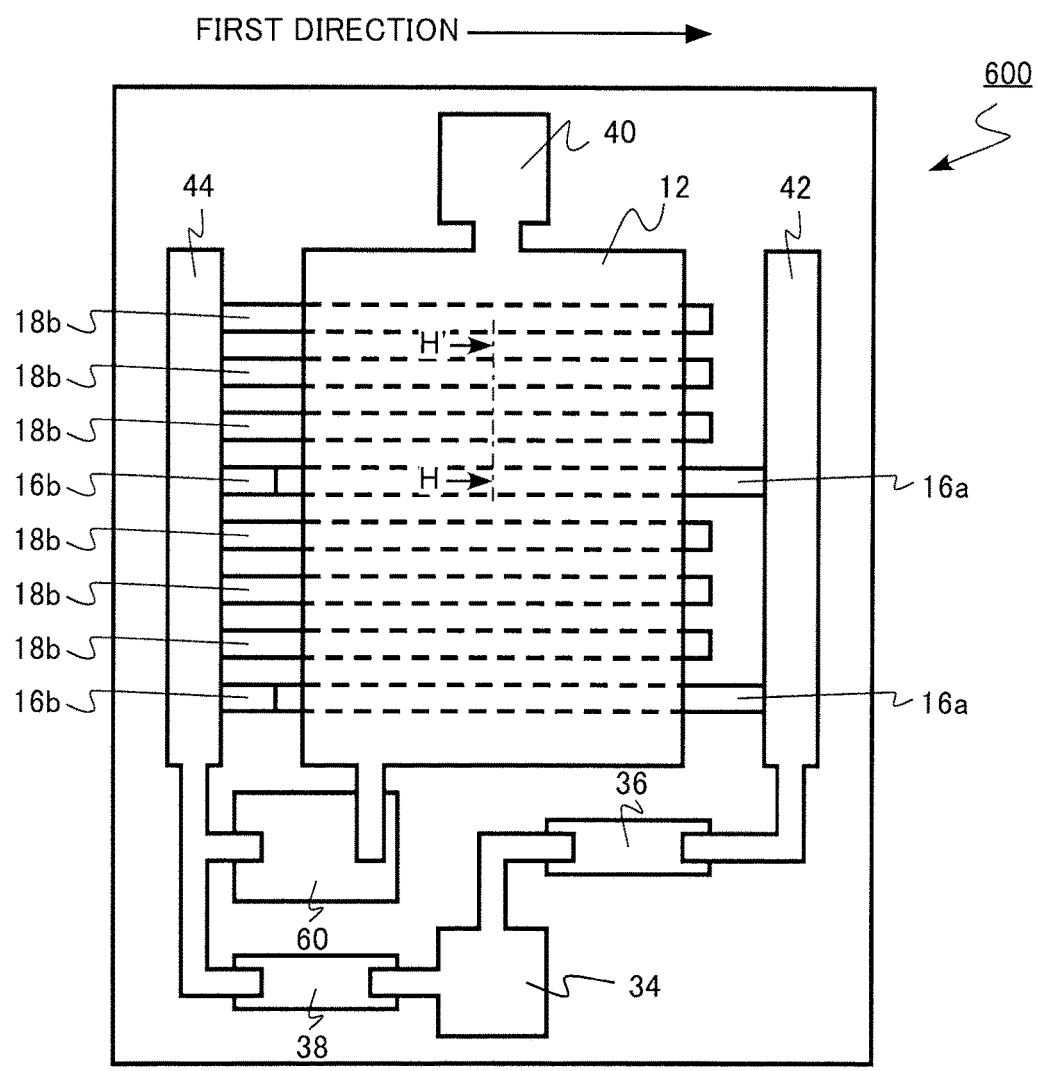
FIG. 19 is a plan view schematically illustrating a semiconductor device according to a sixth embodiment.
Figure 20A:
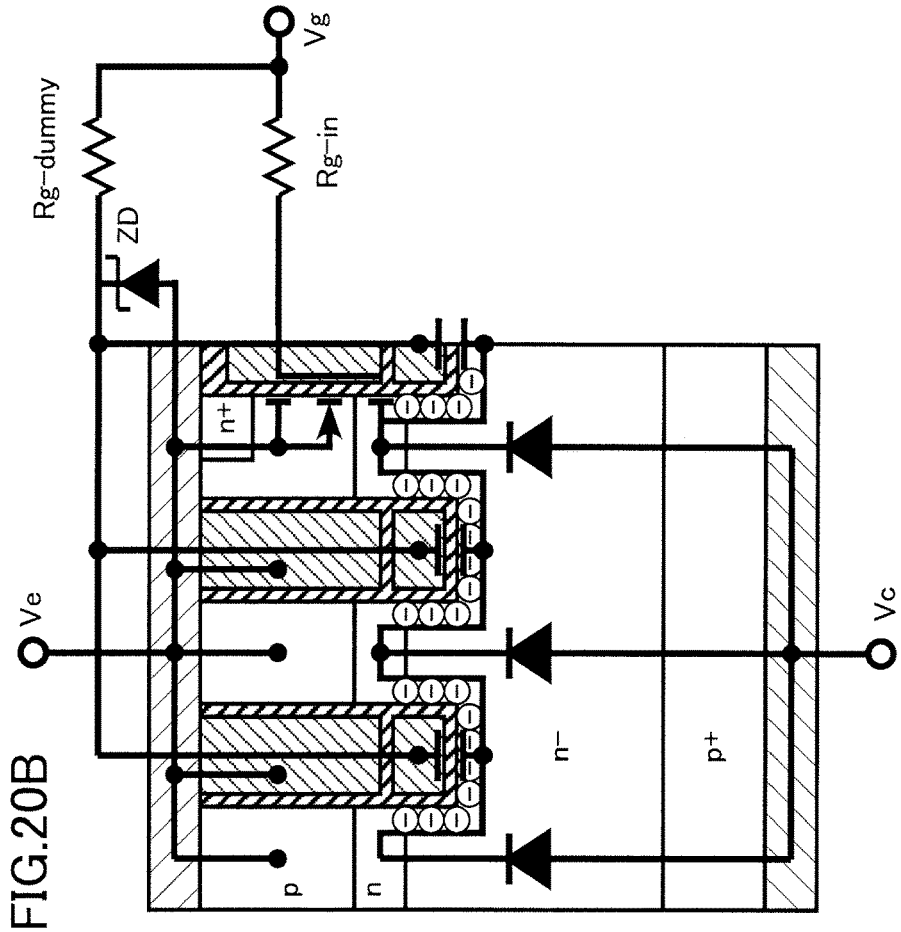
FIGS. 20A and 20B are cross-sectional views schematically illustrating the semiconductor device according to the sixth embodiment.
Figure 20B:
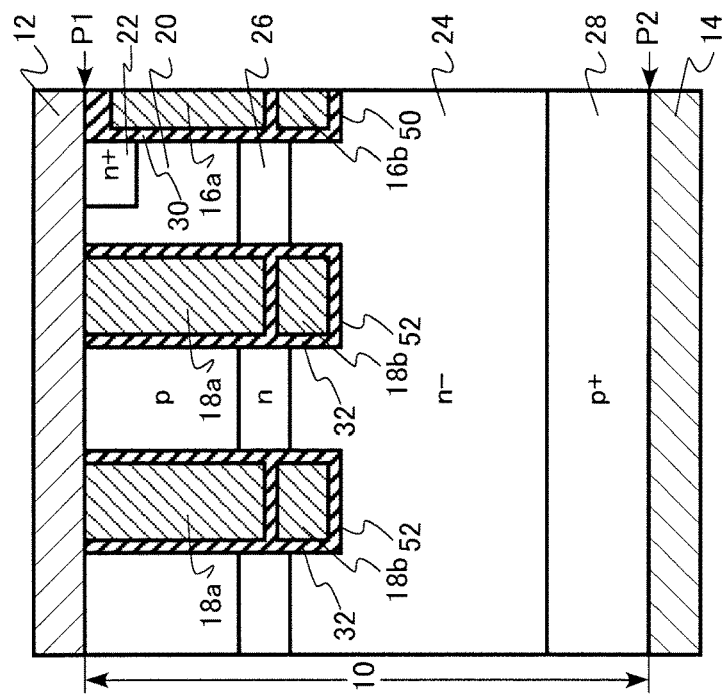

FIG. 19 is a plan view schematically illustrating the semiconductor device according to this embodiment. FIGS. 20A and 20B are cross-sectional views schematically illustrating the semiconductor device according to this embodiment. FIG. 20A is a cross-sectional view taken along the line HH' of FIG. 19. FIG. 20B is a diagram in which an equivalent circuit is overwritten on FIG. 20A.

The semiconductor device according to this embodiment is a trench IGBT 600 in which a gate electrode is provided in a trench formed in a semiconductor layer. The trench IGBT 600 is a thinning out-type IGBT including a dummy trench gate electrode. The trench IGBT 600 is an IGBT with a double gate electrode structure in which gate electrodes are provided in one trench so as to be separated from each other in the vertical direction.

The trench IGBT 600 includes a zener diode 60 (ZD in FIG. 20B) having an anode and a cathode. The anode is electrically connected to the emitter electrode 12. The cathode is connected between the dummy gate resistor 38 (second electric resistor) and the lower dummy trench gate electrode 18b. The cathode is connected between the dummy gate resistor 38 (second electric resistor) and the lower trench gate electrode 16b. The zener diode 60 is made of, for example, polysilicon.

In this embodiment, the feedback capacitor between the collector and the gate is bypassed to the emitter electrode 12 by the zener diode 60. Therefore, the feedback capacitor can be charged and discharged with a smaller amount of gate current than that in a case in which the zener diode 60 is not provided. As a result, the switching speed is improved when the IGBT is turned off.

It is preferable to increase the resistance value of the dummy gate resistor (Rg-dummy) in order to turn on the zener diode 60 when the trench IGBT 600 is turned off.

The zener voltage of the zener diode 60 is higher than a gate on voltage that is applied to the gate pad electrode 34 (first gate pad electrode) when the trench IGBT 600 is turned on. Since the zener voltage of the zener diode 60 is higher than the gate on voltage when the trench IGBT 600 is turned on, the zener diode 60 is turned on when the trench IGBT 600 is turned on and the malfunction of the trench IGBT 600 is prevented.

Figure 21A:
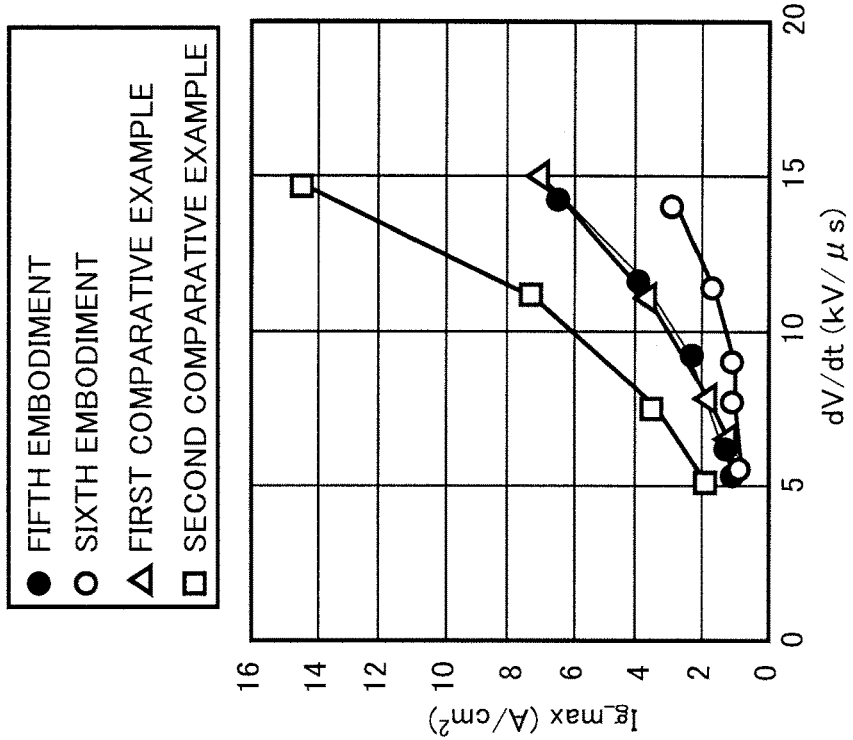
FIGS. 21A and 21B are diagrams illustrating the function and effect of the semiconductor device according to the sixth embodiment.
Figure 21B:
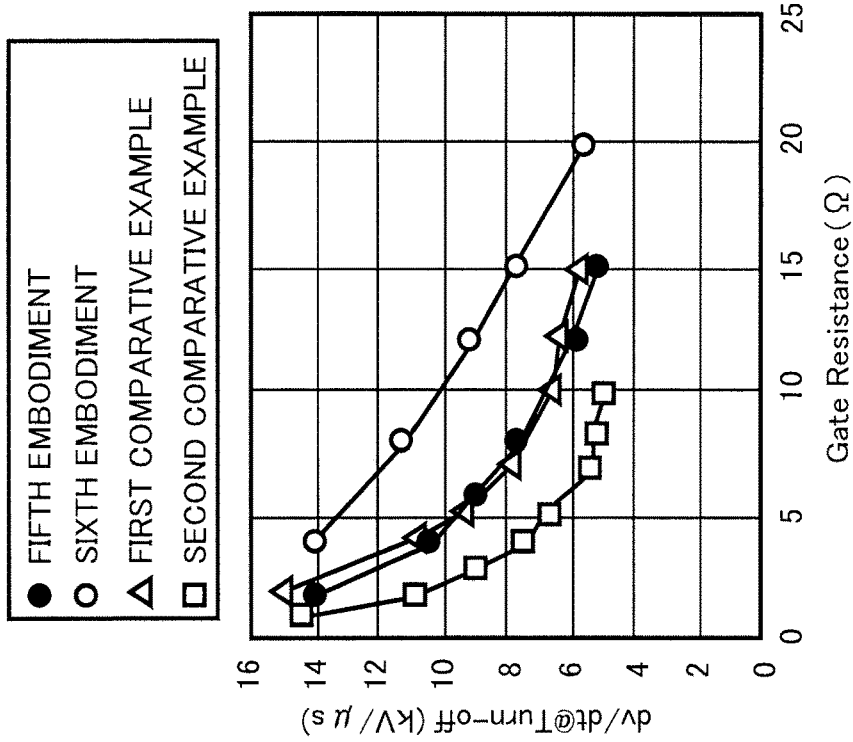

FIGS. 21A and 21B are diagrams illustrating the function and effect of the semiconductor device according to this embodiment. FIG. 21A is a diagram illustrating a relationship between gate resistance and the time rate of change in the collector-emitter voltage (Vce) (dV/dt) when the IGBT is turned off. The resistance value of the gate resistor is the resistance value of the external gate resistor that is provided outside the IGBT. The time rate of change in the collector-emitter voltage (Vce) (dV/dt) is an index indicating the switching speed when the IGBT is turned off. FIG. 21B is a diagram illustrating a relationship between the maximum value of a gate current (Ig) and the time rate of change in the collector-emitter voltage (Vce) (dV/dt) when the IGBT is turned off.

FIGS. 21A and 21B also illustrate the trench IGBT 500 according to the fifth embodiment and the trench IGBTs 800 and 900 according to the first and second comparative examples described in the first embodiment for comparison.

As can be seen from FIG. 21A, in this embodiment, the time rate of change (dV/dt) is higher than that in the first comparative example and the switching speed is improved when the IGBT is turned off. In addition, since linearity that is higher than that in the first comparative example is obtained, the controllability of the switching speed by the external gate resistor is improved.

In addition, as can be seen from FIG. 21A, in this embodiment, the time rate of change (dV/dt) is higher than that in the fifth embodiment and the switching speed is improved when the IGBT is turned off. In addition, since linearity that is higher than that in the fifth embodiment is obtained, the controllability of the switching speed by the external gate resistor is improved. The reason is that, in this embodiment, the lower trench gate electrode 16b is provided unlike the fifth embodiment and almost all of the feedback capacitors are bypassed to the emitter electrode.

As can be seen from FIG. 21B, in this embodiment, it is possible to achieve a high switching speed with a small amount of gate current.

As described above, according to the trench IGBT 600 of this embodiment, it is possible to achieve an IGBT with low on-resistance and a high switching speed.

In the first to sixth embodiments, a case in which the semiconductor layer is made of single-crystal silicon has been described as an example. However, the material forming the semiconductor layer is not limited to the single-crystal silicon. For example, the semiconductor layer may be made of other single-crystal semiconductors such as single-crystal silicon carbide.

In the first to sixth embodiments, a case in which three dummy trench gate electrodes are interposed between two trench gate electrodes has been described as an example. However, the number of dummy trench gate electrodes is not limited to three. For example, one or two dummy trench gate electrodes may be provided or four or more dummy trench gate electrodes may be provided.

While certain embodiments have been described, these embodiments have been presented by way of example only, and are not intended to limit the scope of the inventions. Indeed, the semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
a semiconductor layer having a first plane and a second plane opposite to the first plane;
an emitter electrode, at least a portion of the emitter electrode being in contact with the first plane;
a collector electrode, at least a portion of the collector electrode being in contact with the second plane;

a trench gate electrode provided in the semiconductor layer, the trench gate electrode extending in a first direction substantially parallel to the first plane;

a dummy trench gate electrode provided in the semiconductor layer, the dummy trench gate electrode extending in the first direction;

a p base region provided in the semiconductor layer;

an n-type emitter region provided between the p base region and the first plane in the semiconductor layer, the n-type emitter region being electrically connected to the emitter electrode;

an n base region provided between the p base region and the second plane in the semiconductor layer;

a p-type collector region provided between the n base region and the second plane in the semiconductor layer, the p-type collector region being electrically connected to the collector electrode;

a trench gate insulating film provided between the trench gate electrode and the p base region, between the trench gate electrode and the emitter region, and between the trench gate electrode and the n base region, the trench gate insulating film being in contact with the p base region, the emitter region, and the n base region;

a dummy trench gate insulating film provided between the dummy trench gate electrode and the p base region and between the dummy trench gate electrode and the n base region, the dummy trench gate insulating film being in contact with the p base region and the n base region;

a first gate pad electrode electrically connected to the trench gate electrode and the dummy trench gate electrode;

a first electric resistor electrically connected between the first gate pad electrode and the trench gate electrode; and a second electric resistor electrically connected between the first gate pad electrode and the dummy trench gate electrode, wherein a CR time constant of the trench gate electrode is less than a CR time constant of the dummy trench gate electrode, and a CR time constant is defined by a product of capacitance and resistance.

2. The semiconductor device according to claim 1, further comprising:

a first connection wire electrically connected between the trench gate electrode and the first electric resistor; and a second connection wire electrically connected between the dummy trench gate electrode and the second electric resistor, wherein the trench gate electrode and the dummy trench gate electrode are located between the first connection wire and the second connection wire.

3. The semiconductor device according to claim 2, wherein a material forming the first electric resistor and the second electric resistor has a higher resistivity than a material forming the first connection wire and the second connection wire.

4. The semiconductor device according to claim 1, wherein the first electric resistor and the second electric resistor are made of polysilicon.

5. The semiconductor device according to claim 1, further comprising:

a third electric resistor electrically connected between the second electric resistor and the dummy trench gate electrode;

a fourth electric resistor electrically connected between the third electric resistor and the dummy trench gate electrode;

a second gate electrode pad electrically connected between the second electric resistor and the third electric resistor; and a third gate electrode pad electrically connected between the third electric resistor and the dummy trench gate electrode.

6. The semiconductor device according to claim 1, further comprising:

an n-type semiconductor region provided between the p base region and the n base region, the n-type semiconductor region having a higher n-type impurity concentration than the n base region.

7. The semiconductor device according to claim 1, further comprising:

a zener diode including an anode and a cathode, the anode being electrically connected to the emitter electrode, the cathode being connected between the second electric resistor and the dummy trench gate electrode.

8. The semiconductor device according to claim 7, wherein a zener voltage of the zener diode is higher than a gate on voltage applied to the first gate pad electrode.

9. The semiconductor device according to claim 7, wherein the zener diode is made of polysilicon.

10. A semiconductor device comprising:

a semiconductor layer having a first plane and a second plane opposite to the first plane;

a first emitter electrode, at least a portion of the first emitter electrode being in contact with the first plane;

a first collector electrode, at least a portion of the first collector electrode being in contact with the second plane;

a first trench gate electrode provided in the semiconductor layer, the first trench gate electrode extending in a first direction substantially parallel to the first plane;

a first dummy trench gate electrode provided in the semiconductor layer, the first dummy trench gate electrode extending in the first direction;

a first p base region provided in the semiconductor layer;

an n-type first emitter region provided between the first p base region and the first plane in the semiconductor layer, the n-type first emitter region being electrically connected to the first emitter electrode;

a first n base region provided between the first p base region and the second plane in the semiconductor layer;

a p-type first collector region provided between the first n base region and the second plane in the semiconductor layer, the p-type first collector region being electrically connected to the first collector electrode;

a first trench gate insulating film provided between the first trench gate electrode and the first p base region, between the first trench gate electrode and the first emitter region, and between the first trench gate electrode and the first n base region, the first trench gate insulating film being in contact with the first p base region, the first emitter region, and the first n base region;

a first dummy trench gate insulating film provided between the first dummy trench gate electrode and the first p base region and between the first dummy trench gate electrode and the first n base region, the first dummy trench gate insulating film being in contact with the first p base region and the first n base region;

a second emitter electrode, at least a portion of the second emitter electrode being in contact with the first plane;

a second collector electrode, at least a portion of the second collector electrode being in contact with the second plane;
a second trench gate electrode provided in the semiconductor layer, the second trench gate electrode extending in the first direction;
a second dummy trench gate electrode provided in the semiconductor layer, the second dummy trench gate electrode extending in the first direction;
a second p base region provided in the semiconductor layer;
an n-type second emitter region provided between the second p base region and the first plane in the semiconductor layer, the n-type second emitter region being electrically connected to the second emitter electrode;
a second n base region provided between the second p base region and the second plane in the semiconductor layer;
a p-type second collector region provided between the second n base region and the second plane in the semiconductor layer, the p-type second collector region being electrically connected to the second collector electrode;
a second trench gate insulating film provided between the second trench gate electrode and the second p base region, between the second trench gate electrode and the second emitter region, and between the second trench gate electrode and the second n base region, the second trench gate insulating film being in contact with the second p base region, the second emitter region, and the second n base region;
a second dummy trench gate insulating film provided between the second dummy trench gate electrode and the second p base region and between the second dummy trench gate electrode and the second n base region, the second dummy trench gate insulating film being in contact with the second p base region and the second n base region;
a gate pad electrode electrically connected to the first trench gate electrode, the first dummy trench gate electrode, the second trench gate electrode, and the second dummy trench gate electrode;
a first electric resistor electrically connected between the gate pad electrode and the first trench gate electrode;
a second electric resistor electrically connected between the gate pad electrode and the first dummy trench gate electrode,
a third electric resistor electrically connected between the gate pad electrode and the second trench gate electrode; and
a fourth electric resistor electrically connected between the gate pad electrode and the second dummy trench gate electrode,
wherein a CR time constant of the first trench gate electrode is less than a CR time constant of the first dummy trench gate electrode,
a CR time constant of the second trench gate electrode is less than a CR time constant of the second dummy trench gate electrode, and
a CR time constant is defined by a product of capacitance and resistance.

11. The semiconductor device according to claim 10, further comprising:
a first connection wire electrically connected between the first trench gate electrode and the first electric resistor;
a second connection wire electrically connected between the first dummy trench gate electrode and the second electric resistor;
a third connection wire electrically connected between the second trench gate electrode and the third electric resistor; and
a fourth connection wire electrically connected between the second dummy trench gate electrode and the fourth electric resistor;
wherein the first trench gate electrode and the first dummy trench gate electrode are located between the first connection wire and the second connection wire, and
the second trench gate electrode and the second dummy trench gate electrode are located between the third connection wire and the fourth connection wire.

12. The semiconductor device according to claim 10,
wherein the first electric resistor, the second electric resistor, the third electric resistor, and the fourth electric resistor are made of polysilicon.

13. A semiconductor device comprising:
a semiconductor layer having a first plane and a second plane opposite to the first plane;
an emitter electrode, at least a portion of the emitter electrode being in contact with the first plane;
a collector electrode, at least a portion of the collector electrode being in contact with the second plane;
an upper trench gate electrode provided in the semiconductor layer, the upper trench gate electrode extending in a first direction substantially parallel to the first plane;
a lower trench gate electrode provided between the upper trench gate electrode and the second plane in the semiconductor layer, the lower trench gate electrode extending in the first direction, the lower trench gate electrode being electrically separated from the upper trench gate electrode;
an upper dummy trench gate electrode provided in the semiconductor layer, the upper dummy trench gate electrode extending in the first direction;
a lower dummy trench gate electrode provided between the upper dummy trench gate electrode and the second plane in the semiconductor layer, the lower dummy trench gate electrode extending in the first direction, the lower dummy trench gate electrode being electrically separated from the upper dummy trench gate electrode;
a p base region provided in the semiconductor layer;
air n-type emitter region provided between the p base region and the first plane in the semiconductor layer, the n-type emitter region being electrically connected to the emitter electrode;
an n base region provided between the p base region and the second plane in the semiconductor layer;
a p-type collector region provided between the n base region and the second plane in the semiconductor layer, the p-type collector region being electrically connected to the collector electrode;
a trench gate insulating film provided between the upper trench gate electrode and the p base region, between the upper trench gate electrode and the emitter region, and between the lower trench gate electrode and the n base region, the trench gate insulating film being in contact with the p base region, the emitter region, and the n base region;
a dummy trench gate insulating film provided between the upper dummy trench gate electrode and the p base region and between the lower dummy trench gate electrode and the n base region, the dummy trench gate insulating film being in contact with the p base region and the n base region;

a first gate pad electrode electrically connected to the upper trench gate electrode, the lower trench gate electrode, and the lower dummy trench gate electrode;

a first electric resistor electrically connected between the first gate pad electrode and the upper trench gate electrode; and a second electric resistor electrically connected between the first gate pad electrode and the lower trench gate electrode and between the first gate pad electrode and the lower dummy trench gate electrode, wherein a CR time constant of the upper trench gate electrode is less than a CR time constant of the lower dummy trench gate electrode, and a CR time constant is defined by a product of capacitance and resistance.

14. The semiconductor device according to claim 13, further comprising:

a first connection wire electrically connected between the upper trench gate electrode and the first electric resistor; and a second connection wire electrically connected between the lower dummy trench gate electrode and the second electric resistor, wherein the upper trench gate electrode and the lower dummy trench gate electrode are located between the first connection wire and the second connection wire.

15. The semiconductor device according to claim 13, wherein the first electric resistor and the second electric resistor are made of polysilicon.

16. The semiconductor device according to claim 13, further comprising:

an n-type semiconductor region provided between the p base region and the n base region, the n-type semiconductor region having a higher n-type impurity concentration than the n base region.

17. The semiconductor device according to claim 16, wherein a distance from the first plane to an interface between the n base region and the n-type semiconductor region is greater than a distance from the first plane to the lower trench gate electrode, and the distance from the first plane to the interface between the n base region and the n-type semiconductor region is greater than a distance from the first plane to the lower dummy trench gate electrode.

18. The semiconductor device according to claim 13, wherein the upper dummy trench gate electrode is connected to the emitter electrode.

19. The semiconductor device according to claim 13, further comprising:

a zener diode including an anode and a cathode, the anode being electrically connected to the emitter electrode, the cathode being connected between the second electric resistor and the lower dummy trench gate electrode and between the second electric resistor and the lower trench gate electrode.

20. The semiconductor device according to claim 19, wherein a zener voltage of the zener diode is higher than a gate on voltage applied to the first gate pad electrode.

* * * * *